(12) United States Patent
Masleid

(10) Patent No.: US 7,768,356 B2
(45) Date of Patent: Aug. 3, 2010

(54) DYNAMIC RING OSCILLATORS

(76) Inventor: Robert P Masleid, 17266 Eaton La., Monte Sereno, CA (US) 95930

( * ) Notice: Subject to any disclaimer, the term of this patent is extended or adjusted under 35 U.S.C. 154(b) by 0 days.

(21) Appl. No.: 12/194,504

(22) Filed: Aug. 19, 2008

(65) Prior Publication Data

US 2008/0303600 A1 Dec. 11, 2008

Related U.S. Application Data

(63) Continuation of application No. 11/322,595, filed on Dec. 30, 2005, now Pat. No. 7,414,485.

(51) Int. Cl.
 *H03B 5/24* (2006.01)
 *H03H 11/26* (2006.01)
(52) U.S. Cl. .............................. 331/57; 331/44; 327/288
(58) Field of Classification Search ................... 331/44, 331/45, 57, 175; 327/261, 285, 288
 See application file for complete search history.

(56) References Cited

U.S. PATENT DOCUMENTS

| | | | |
|---|---|---|---|
| 3,991,380 A | 11/1976 | Pryor | |
| 4,498,021 A | 2/1985 | Uya | |
| 4,739,252 A | 4/1988 | Malaviya et al. | |
| 5,128,560 A | 7/1992 | Chern et al. | |
| 5,166,555 A | 11/1992 | Kano | |
| 5,264,738 A | 11/1993 | Veendrick et al. | |
| 5,297,086 A | 3/1994 | Nasu et al. | |
| 5,410,278 A | 4/1995 | Itoh et al. | |
| 5,414,312 A | 5/1995 | Wong | |
| 5,416,861 A | 5/1995 | Koh et al. | |
| 5,455,521 A | 10/1995 | Dobbelaere | |
| 5,467,038 A | 11/1995 | Motley et al. | |
| 5,497,105 A | 3/1996 | Oh et al. | |
| 5,525,616 A | 6/1996 | Platt et al. | |
| 5,568,103 A | 10/1996 | Nakashima et al. | |

(Continued)

FOREIGN PATENT DOCUMENTS

EP 1398639 3/2004

(Continued)

OTHER PUBLICATIONS

Chen, G. et al., "Dynamic NBTI of P-MOS Transistors and its impact on MOSFET Scaling", IEEE Electron Device Letters, 2002, pp. 1-3.

(Continued)

*Primary Examiner*—David Mis

(57) ABSTRACT

A dynamic oscillating ring circuit is described, which has multiple non-inverting domino circuits, each having a signal input, a trigger input, inputs for charge state clock and clocked cutoff and an output inverter. A number of the domino circuits are coupled in series, the output of one feeding the input of the next, to form a chain, which form stages of the ring. A number of the stages are coupled in series, the output of one feeding the input of the next, to form the ring. The first domino circuit of said chain receives a logic signal input and a single trigger input for the chain. Within the ring, the output of each stage feeds the input signal to the next stage and is fed back to clock an earlier stage to allow the ring to oscillate.

16 Claims, 13 Drawing Sheets

U.S. PATENT DOCUMENTS

| | | | |
|---|---|---|---|
| 5,594,360 | A | 1/1997 | Wojciechowski |
| 5,677,650 | A | 10/1997 | Kwasniewski et al. |
| 5,680,359 | A | 10/1997 | Jeong |
| 5,698,774 | A | 12/1997 | Osmanski |
| 5,698,994 | A | 12/1997 | Tsuji |
| 5,764,110 | A | 6/1998 | Ishibashi |
| 5,767,700 | A | 6/1998 | Lee |
| 5,793,715 | A | 8/1998 | Alon et al. |
| 5,796,313 | A | 8/1998 | Eitan |
| 5,811,983 | A | 9/1998 | Lundberg |
| 5,880,608 | A | 3/1999 | Mehta et al. |
| 5,963,043 | A | 10/1999 | Nassif |
| 5,963,074 | A | 10/1999 | Arkin |
| 5,969,543 | A | 10/1999 | Erickson et al. |
| 5,977,763 | A | 11/1999 | Loughmiller et al. |
| 5,982,211 | A | 11/1999 | Ko |
| 6,011,403 | A | 1/2000 | Gillette |
| 6,025,738 | A | 2/2000 | Masleid |
| 6,028,490 | A | 2/2000 | Komatsu |
| 6,031,403 | A | 2/2000 | Gersbach |
| 6,087,886 | A | 7/2000 | Ko |
| 6,114,840 | A | 9/2000 | Farrell et al. |
| 6,127,872 | A | 10/2000 | Kumata |
| 6,154,099 | A | 11/2000 | Suzuki et al. |
| 6,154,100 | A | 11/2000 | Okamoto |
| 6,172,545 | B1 | 1/2001 | Ishii |
| 6,172,943 | B1 | 1/2001 | Yuzuki |
| 6,188,260 | B1 | 2/2001 | Stotz et al. |
| 6,204,710 | B1 | 3/2001 | Goetting et al. |
| 6,229,747 | B1 | 5/2001 | Cho et al. |
| 6,238,522 | B1 | 5/2001 | Graf |
| 6,242,936 | B1 | 6/2001 | Ho et al. |
| 6,242,937 | B1 | 6/2001 | Lee et al. |
| 6,262,601 | B1 | 7/2001 | Choe et al. |
| 6,281,706 | B1 | 8/2001 | Wert et al. |
| 6,321,282 | B1 | 11/2001 | Horowitz et al. |
| 6,400,230 | B2 | 6/2002 | Fairbanks |
| 6,407,571 | B1 | 6/2002 | Furuya et al. |
| 6,426,641 | B1 | 7/2002 | Koch et al. |
| 6,455,901 | B2 | 9/2002 | Kameyama et al. |
| 6,476,632 | B1 | 11/2002 | La Rosa et al. |
| 6,489,796 | B2 | 12/2002 | Tomishima |
| 6,535,014 | B2 | 3/2003 | Chetlur et al. |
| 6,538,471 | B1 | 3/2003 | Stan et al. |
| 6,538,522 | B1 | 3/2003 | Aipperspach et al. |
| 6,538,957 | B2 | 3/2003 | Magoshi |
| 6,545,519 | B1 | 4/2003 | Carballo |
| 6,570,407 | B1 | 5/2003 | Sugisawa et al. |
| 6,573,777 | B2 | 6/2003 | Saint-Laurent et al. |
| 6,577,157 | B1 | 6/2003 | Cheung et al. |
| 6,577,176 | B1 | 6/2003 | Masleid et al. |
| 6,621,318 | B1 | 9/2003 | Burr |
| 6,657,504 | B1 | 12/2003 | Deal et al. |
| 6,664,837 | B1 | 12/2003 | Oh et al. |
| 6,690,242 | B2 | 2/2004 | Fang et al. |
| 6,696,863 | B2 | 2/2004 | Yamamoto et al. |
| 6,697,929 | B1 | 2/2004 | Cherkauer et al. |
| 6,724,214 | B2 | 4/2004 | Manna et al. |
| 6,731,140 | B2 | 5/2004 | Masleid et al. |
| 6,731,179 | B2 | 5/2004 | Abadeer et al. |
| 6,759,863 | B2 | 7/2004 | Moore |
| 6,762,966 | B1 | 7/2004 | LaRosa et al. |
| 6,774,734 | B2 | 8/2004 | Christensen et al. |
| 6,798,230 | B1 | 9/2004 | Taylor et al. |
| 6,815,971 | B2 | 11/2004 | Wang et al. |
| 6,815,977 | B2 | 11/2004 | Sabbavarapu et al. |
| 6,831,494 | B1 | 12/2004 | Fu et al. |
| 6,882,172 | B1 | 4/2005 | Suzuki et al. |
| 6,885,210 | B1 | 4/2005 | Suzuki |
| 6,903,564 | B1 | 6/2005 | Suzuki |
| 7,038,483 | B1 | 5/2006 | Suzuki et al. |
| 7,046,094 | B2 * | 5/2006 | Belluomini et al. ........... 331/44 |
| 7,053,680 | B2 | 5/2006 | Masleid et al. |
| 7,119,580 | B2 | 10/2006 | Masleid et al. |
| 7,126,365 | B2 | 10/2006 | Suzuki |
| 7,212,022 | B2 | 5/2007 | Suzuki |
| 7,235,998 | B1 | 6/2007 | Suzuki |
| 7,304,503 | B2 | 12/2007 | Masleid et al. |
| 7,315,178 | B1 | 1/2008 | Suzuki |
| 7,336,103 | B1 | 2/2008 | Masleid et al. |
| 7,414,485 | B1 | 8/2008 | Masleid |
| 2001/0000426 | A1 | 4/2001 | Sung et al. |
| 2001/0028278 | A1 | 10/2001 | Ooishi |
| 2001/0030561 | A1 | 10/2001 | Asano et al. |
| 2001/0052623 | A1 | 12/2001 | Kameyama et al. |
| 2002/0056016 | A1 | 5/2002 | Horowitz et al. |
| 2002/0178415 | A1 | 11/2002 | Saraf |
| 2003/0057775 | A1 | 3/2003 | Yamashita et al. |
| 2003/0127241 | A1 | 7/2003 | Russell et al. |
| 2003/0160630 | A1 | 8/2003 | Earle |
| 2003/0189465 | A1 | 10/2003 | Abadeer et al. |
| 2003/0231713 | A1 | 12/2003 | Masleid et al. |
| 2004/0044983 | A1 | 3/2004 | Dillon et al. |
| 2004/0104731 | A1 | 6/2004 | Vollertsen |
| 2004/0119501 | A1 | 6/2004 | Sabbavarapu et al. |
| 2004/0119503 | A1 | 6/2004 | Jamshidi et al. |
| 2004/0148111 | A1 | 7/2004 | Gauthier et al. |
| 2004/0257115 | A1 | 12/2004 | Bertram et al. |
| 2005/0184720 | A1 | 8/2005 | Bernstein et al. |
| 2005/0212547 | A1 | 9/2005 | Suzuki |
| 2005/0248368 | A1 | 11/2005 | Bertram et al. |
| 2007/0136707 | A1 | 6/2007 | Teig et al. |

FOREIGN PATENT DOCUMENTS

| | | |
|---|---|---|
| JP | 03089624 | 4/1991 |
| JP | 04091516 | 3/1992 |

OTHER PUBLICATIONS

Lima T., et al., "Capacitance Coupling Immune, Transient Sensitive Accelerator For Resistive Interconnect Signals of Subquarter Micron ULSI" IEEE Journal of Solid-State Circuits, IEEE Inc. New York, US pp. 531-536. cited by other. Apr. 1996.

Nalamalpu et al., "Boosters for Driving Long On Chip Interconnects-Design Issues, Interconnect Synthesis, and Comparison With Repeaters", Jan. 2002, IEEE Transactions on Computer-Aided design of integrated circuits and systems, vol. 21, No. 1, pp. 50-62. cited by other.

Peters, Laura, "NBTI: A Growing Threat to Device Reliability", Semiconductor International, Mar. 1, 2004, http://www.reed-electronics.com/semiconductor/article/CA386329?industryid=3033.

Notice of Allowance, Mail Date Jul. 6, 2007; U.S. Appl. No. 11/322,595.

Notice of Allowance, Mail Date Oct. 24, 2007; U.S. Appl. No. 11/322,595.

Notice of Allowance, Mail Date Dec. 5, 2007; U.S. Appl. No. 11/322,595.

Notice of Allowance, Mail Date Apr. 17, 2008; U.S. Appl. No. 11/322,595.

Notice of Allowance, Mail Date Oct. 15, 2007; U.S. Appl. No. 11/322,896.

Notice of Allowance, Mail Date Nov. 21, 2007; U.S. Appl. No. 11/322,896.

Notice of Allowance, Mail Date May 18, 2007; U.S. Appl. No. 11/322,896.

Notice of Allowance, Mail Date Aug. 8, 2008; U.S. Appl. No. 11/322,896.

Non Final Office Action, Mail Date Jan. 2, 2009; U.S. Appl. No. 11/322,896.

Notice of Allowance, Mail Date Mar. 20, 2009; U.S. Appl. No. 11/322,896.

* cited by examiner

10 NFD-CHAIN STAGE (10 x AO22 DELAY)

N FOOTED DOMINO (NFD) OR2 STAGE (DELAY of AO22)

10 NFO-CHAIN STAGE (10 × AO22 DELAY)

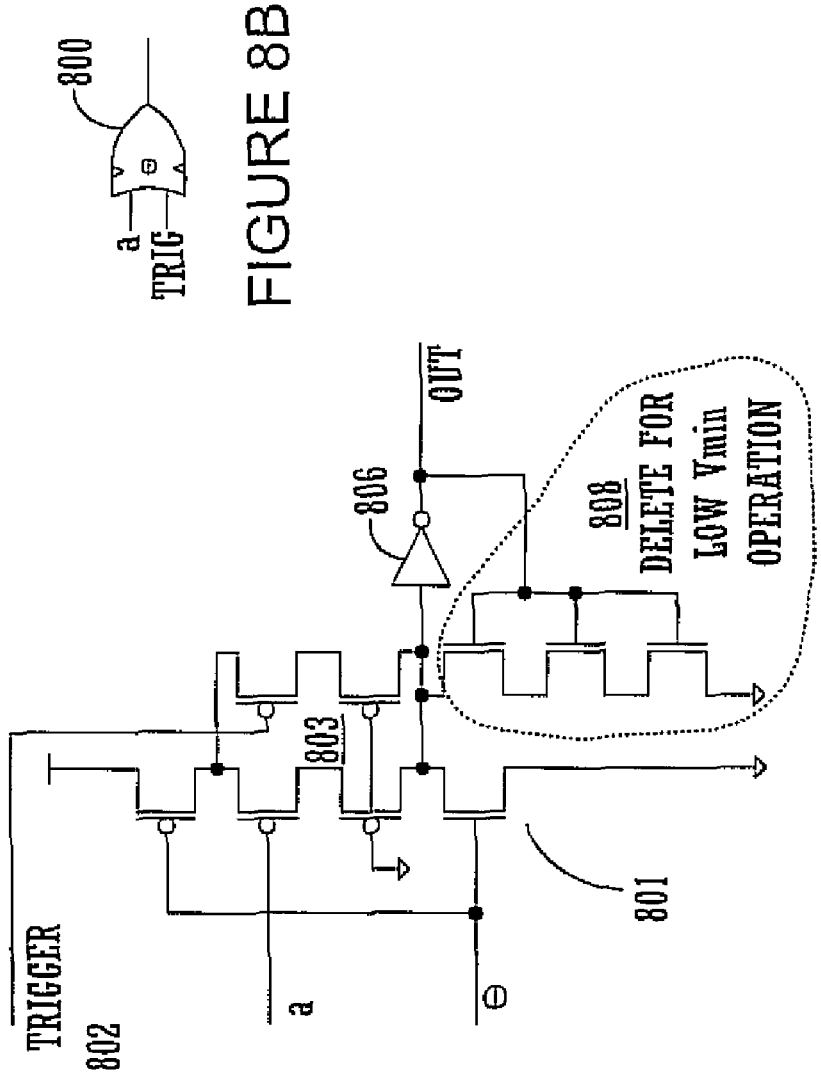

US 7,768,356 B2

DYNAMIC RING OSCILLATORS

CROSS-REFERENCE TO RELATED APPLICATIONS

This is a continuation of U.S. patent application Ser. No. 11/322,595 filed Dec. 30, 2005, now U.S. Pat. No. 7,414,485, which is incorporated in its entirety herein by reference.

BACKGROUND OF THE INVENTION

Ring oscillators conventionally have an odd number of inversion stages and typically use static circuits. These properties can constrain the usefulness of conventional ring oscillators in some applications.

SUMMARY OF THE INVENTION

Accordingly, a ring oscillator that is unconstrained by properties inherent in conventional ring oscillators may achieve utility in the applications in which conventional ring oscillators cannot effectively function.

A dynamic oscillating ring circuit is described, which has multiple non-inverting domino circuits, each having a signal input, a trigger input, inputs for charge state and cutoff clocks and an output inverter. An even number of the domino circuits are coupled in series, the output of one feeding the input of the next, to form a chain, which form stages of the ring. A number of the stages are coupled in series, the output of one feeding the input of the next, to form the ring. The first domino circuit of said chain receives a logic signal input and a single trigger input for the chain. Within the ring, the output of each stage feeds the input signal to the next stage and is fed back to clock an earlier stage to allow the ring to oscillate.

Embodiments of the present invention thus relate to ring oscillators that are unconstrained by properties inherent in conventional ring oscillators. Therefore, embodiments of the present invention may achieve beneficial utility in the applications in which conventional ring oscillators cannot effectively function. For instance, embodiments of the present invention achieve ring oscillators with component elements thereof reflective of a circuit under study (e.g., design, analysis, etc.), in relation to various parameters (e.g., design and/or operating attributes, etc.).

Advantageously, easily observed and measured electrical characteristics of the ring oscillator such as the oscillating frequency (e.g., the operating frequency of the oscillating ring) can reveal more difficult to measure parameters, such as the operating delay of the oscillator's dynamic circuits. Even properties deeply embedded within the microscopic and sub-microscopic structures comprising the component elements of the circuit can be revealed.

For instance, subtle frequency differences between the oscillations of complimentary N type and P-type oscillating rings, which are ostensibly otherwise identical (e.g., in design and fabrication) can indicate relative P to N ratios such as the relative strengths of the component N-type field effect transistors (FETs) and P-type FETs (NFETs and PFETs, respectively). Further, this is indicated by the embodiments described herein, to levels of accuracy and precision that conventionally can be costly and/or troublesome achieve, and require high precision analog apparatus to measure.

BRIEF DESCRIPTION OF THE DRAWINGS

The accompanying drawings, which are incorporated in and form a part of this specification, illustrate embodiments of the present invention and, together with the description, serve to explain the principles of the invention. Unless specifically noted, the drawings referred to in this description are not drawn to scale.

FIG. 8A depicts an exemplary P-footed domino circuit diagram, according to an embodiment of the present invention.

FIG. 8B depicts a representation of an exemplary P-footed domino circuit, according to an embodiment of the present invention.

DETAILED DESCRIPTION OF THE INVENTION

Figures 1A, 1B:
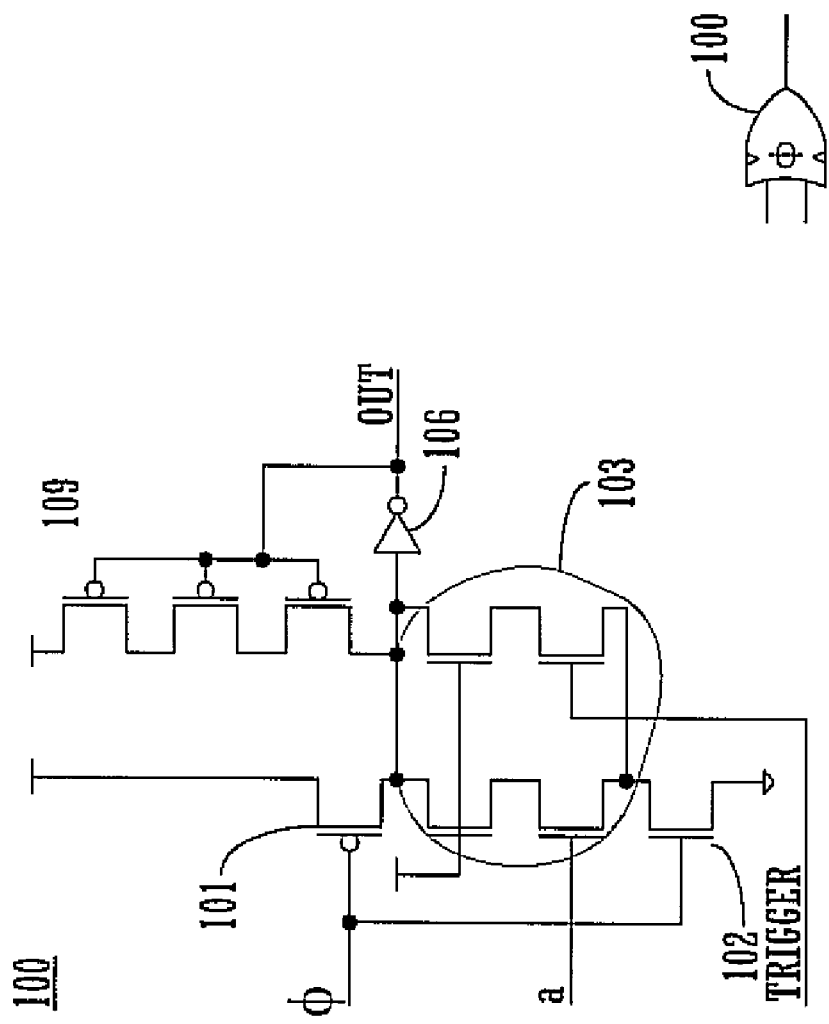
FIG. 1A depicts an exemplary N-footed domino circuit diagram, according to an embodiment of the present; invention.
FIG. 1B depicts a representation of an exemplary N-footed domino circuit, according to an embodiment of the present invention.

The present invention relates to the field of electronics. More specifically, embodiments of the present invention relate to circuits, systems and methods relating to dynamic ring oscillators. Exemplary embodiments of circuits, systems and methods relating to a dynamic ring oscillator are described below. Reference will now be made in detail to embodiments of the present invention, examples of which are illustrated in the accompanying drawings. While the present invention will be described in conjunction with the following embodiments, it will be understood that they are not intended to limit the present invention to these embodiments alone. On the contrary, the present invention is intended to cover alternatives, modifications, and equivalents which may be included within the spirit and scope of the present invention as defined by the appended claims. Furthermore, in the following detailed description of the present invention, numerous specific details are set forth in order to provide a thorough understanding of the present invention. However, embodiments of the present invention may be practiced without these specific details. In other instances, well-known methods, procedures, components, and circuits have not been described in detail so as not to unnecessarily obscure aspects of the present invention.

Embodiments of the present invention include circuits, systems and methods relating to dynamic ring oscillators. The dynamic oscillating ring circuit has multiple non-inverting domino circuits, each having a signal input, a trigger input, inputs for charge state and cutoff clocks and an output inverter. An even number of the domino circuits are coupled in series, the output of one feeding the input of the next, to form a chain, which form stages of the ring. A number of the stages are coupled in series, the output of one feeding the input of the next, to form the ring. The first domino circuit of said chain receives a logic signal input and a single trigger input for the chain. Within the ring, the output of each stage feeds the input signal to the next stage and is fed back to clock an earlier stage to allow the ring to oscillate.

Exemplary N-Footed Domino Circuit

FIG. 1. A depicts an exemplary N-footed domino circuit 100, according to an embodiment of the present invention. The operating frequency of N-footed domino circuit 100 is dominated by NFET attributes. However, P-footed domino circuits, dominated by PFET attributes, can also be implemented, which are complimentary to the N-footed circuits described herein. Domino circuit 100 has a clocked precharge device 101 and a clocked cutoff device 102. Domino circuit 100 has two inactive inputs at Vdd, an active input 'a' and a trigger input. A logic tree 103 performs a logic function. Various logic functions can be implemented with logic tree 103. In one embodiment, logic tree 103 performs a two by two AND/OR function with two series NFETs in parallel with two NFETs.

An inverter 106 buffers and inverts the output of domino circuit 100. The output is fed back to a half latch circuit 109, which acts as a jamb latch, and is latched therewith. In one embodiment, latch circuit 109 comprises a half latch formed by three series coupled devices. This has the benefit of reducing the strength of half latch 109 in relation to downstream pull-down devices, such as are in an evaluation stack as will be described below. Half latch 109 functions to sustain a stable state for circuit 100 where significant leakage may be present, such as wherein circuit 100 comprises ultra-deep sub-micron structures.

Precharge occurs when the clocked cutoff NFET device 101 is turned off, as when the clock is low. With the clocked cutoff NFET 101 off. Inputs are effectively insignificant because their potential paths are in a high impedance state. The low clock at the clocked precharge PFET device 101 turns it on. This charges the dynamic element 103. The half latch 109 functions to reinforce the precharge condition. Thus, if the clock signal disappears, the domino circuit 100 remains in a precharge condition.

FIG. 1B depicts a representation of exemplary N-footed domino circuit 100, according to an embodiment of the present invention. In FIG. 1B, for simplicity in describing exemplary embodiments below, domino circuit 100 (as described with reference to FIG. 1A) is depicted in a simplified symbolism as a logic unit having the two inputs 'a' and 'trigger' and two clock marks, one clock for precharge and the other for foot cutoff.

Exemplary Domino Circuit Chain

Figure 2A:
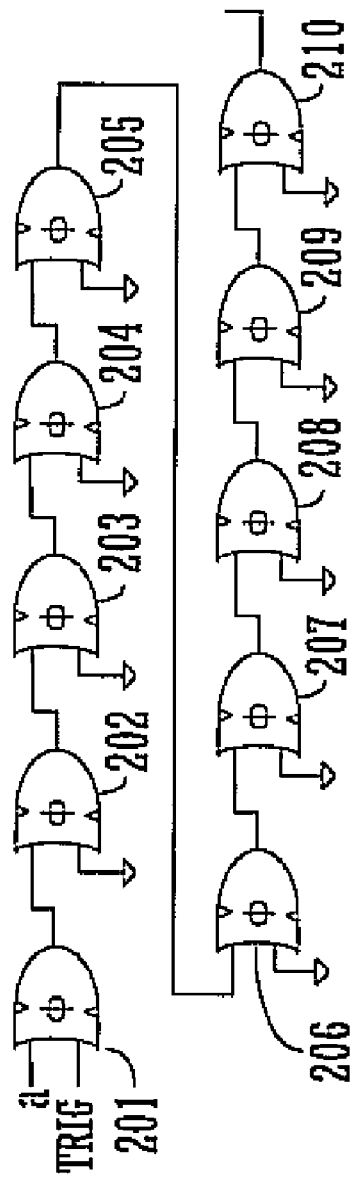
FIG. 2A depicts an exemplary chain of N-domino circuits, according to an embodiment of the present invention.

FIG. 2A depicts an exemplary chain 200 often N-domino circuits 201-210, according to an embodiment of the present invention. Other numbers (e.g., even numbers beside 10) of domino circuits can be so chained. In the present embodiment, the ten domino circuits 201-210, all of them substantially identical to the domino circuit 100 (FIGS. 1A & 1B), are effectively connected together in a simple series configuration to form chain 200.

The input 'a' and the trigger signal are available to domino circuit 201, e.g., the first domino circuit in chain 200. The output of domino circuit 201 effectively comprises the analog of the input 'a' for the subsequent domino circuit 202 in chain 200. The trigger input for domino circuit 202 however is effectively disabled e.g., by grounding, as it is like the other domino circuits 203-210 downstream therefrom. The precharge and foot cutoff clocks are fed to all domino circuits 201-210 in parallel. Thus, the domino circuits 201-210 are clocked effectively simultaneously.

Each domino circuit stage (e.g., domino circuits 201-210) of chain 200 has a certain delay associated with its evaluation operation, e.g., with outputting a logic response based upon receiving an input. It is convenient to consider the exemplary delay associated with a single domino circuit in chain 200 as comprising one delay unit of time.

The delay associated with a signal propagating through chain 200 is greater than a single delay unit. In the present implementation wherein chain 200 may comprise ten individual domino circuits 201-210 in series, its overall chain delay effectively exaggerates the forward evaluate delay associated with a single one of its component domino circuit by a factor often. The precharge time (and foot cutoff) time however is the same for chain 200 as for its individual domino circuit components 201-210, because the precharge (and cutoff signals) are delivered in parallel thereto.

Figure 2B:
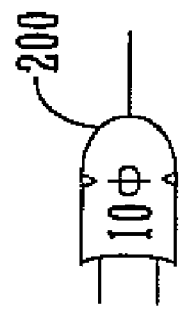
FIG. 2B also depicts a representation of an exemplary chain of N-domino circuits, according to an embodiment of the present invention.

FIG. 2B depicts a representation of exemplary chain 200 of N-domino circuits, according to an embodiment of the present invention. In FIG. 2B, for simplicity in describing exemplary embodiments below, domino circuit chain 200 (as described with, reference to FIG. 2A) is depicted in a simplified symbolism as a ten unit (e.g., series) logic element having the two inputs 'a' and 'trigger' and two clock marks, one clock for precharge and the other for foot cutoff.

Figure 3:
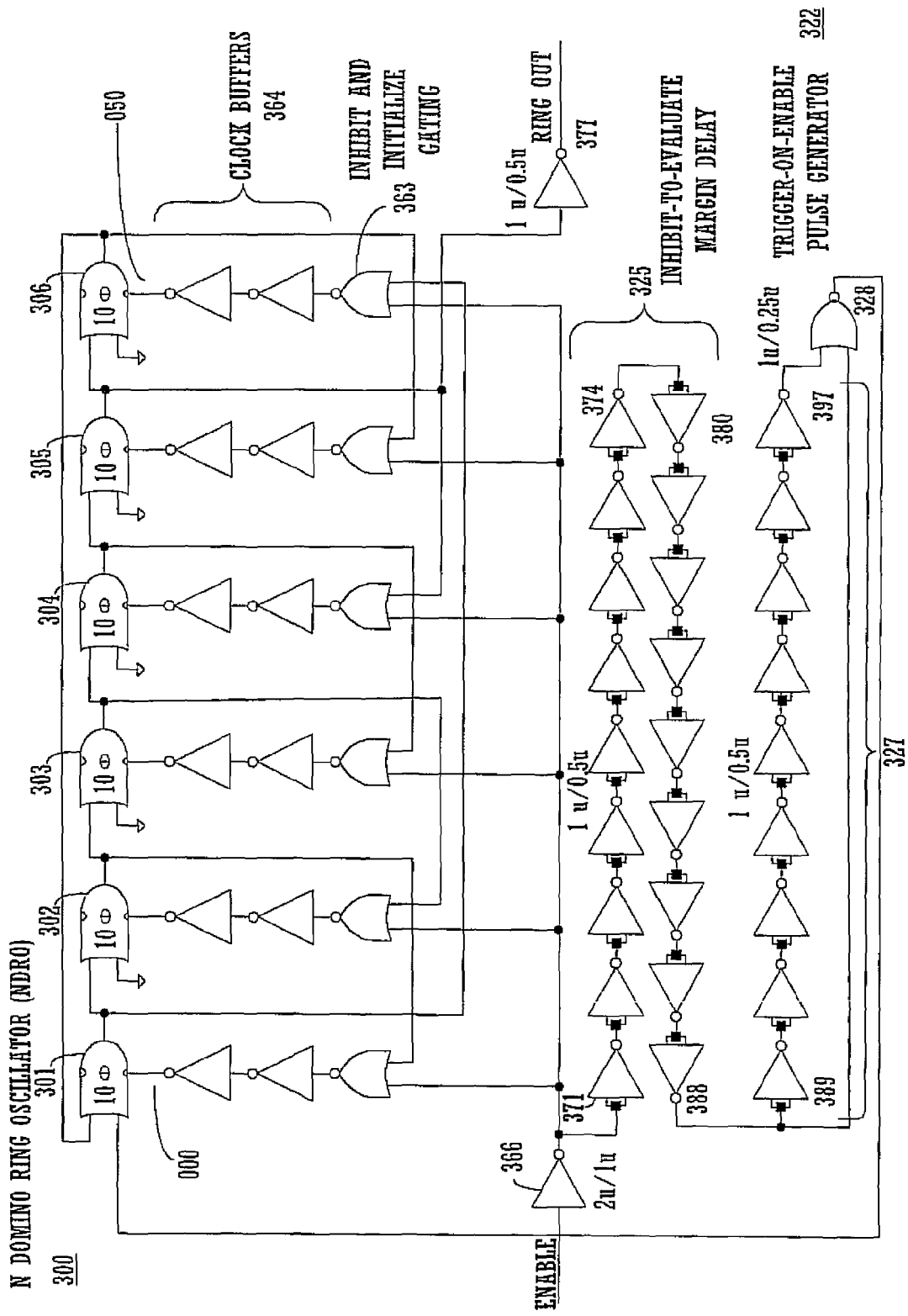
FIG. 3 depicts an exemplary N-Domino ring oscillator, according to an embodiment of the present invention.

FIG. 3 depicts an exemplary N-Domino ring oscillator 300, according to an embodiment of the present invention. Domino ring oscillator 300 effectively comprises a ring of six domino chains 301-306. Other numbers (e.g., numbers beside 6) of domino chains 300 can be so chained. In tire present embodiment, the six domino chains 301-306, all of them substantially identical to the domino chain 200 (FIGS. 2A & 2B), are effectively connected together in a simple ring configuration to form oscillating domino ring 300. The operating frequency of ring 300 can be monitored at any of its outputs. In the present implementation, inverter 377 buffers the output of domino chain 306 to comprise the output of ring 300.

All around the ring 300, the input 'a' of any of chains 301-306 effectively comprises the output of the chain immediately preceding it in the ring 300. Bearing in mind the ring configuration of oscillating ring 300, it may be convenient at least graphically to think of the output of chain 306 as that of the "last" stage in ring 300 as drawn. In that sense, the output of chain 306 can be thought of as being "fed back" to the input 'a' of the "first" stage 301. The trigger input of all the chains except one are effectively disabled (e.g., to ground). In the present implementation, chain 301 is triggered by a pulse generator 322. Inhibit and initialization functions of the domino chains 301-306 are controlled by their respective gates 363 through inverters 364. Gates 363 operate with a clocked enable signal via inverter 366 and an output of another domino chain, e.g., the next subsequent domino chain in ring 300.

Exemplary Timing Diagram

Figure 4:
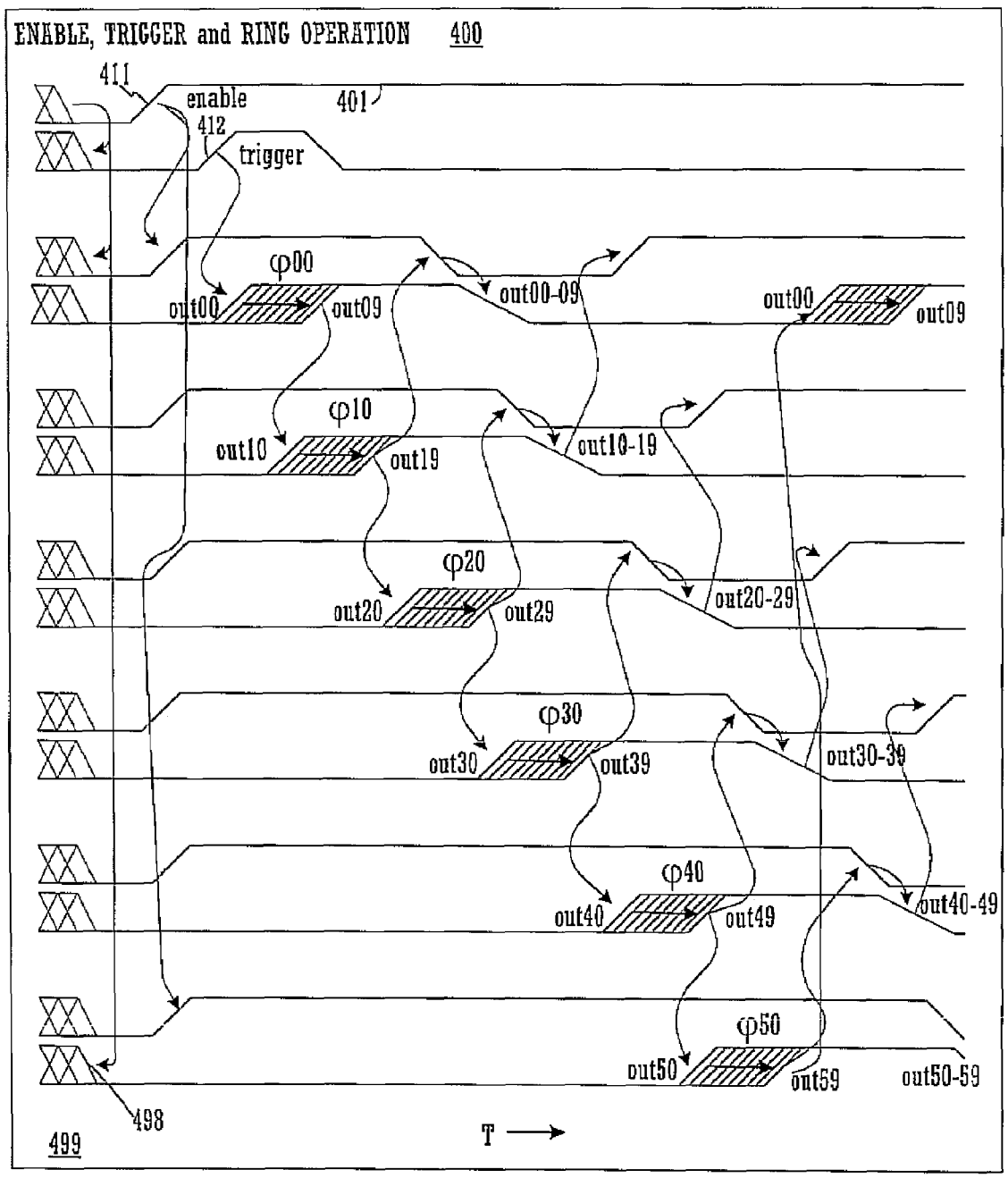
FIG. 4 depicts an exemplary timing sequence for an N-Domino ring oscillator of FIG. 3, according to an embodiment of the present invention.

FIG. 4 depicts an exemplary timing sequence 400 for N-Domino ring oscillator 300 of FIG. 3, according to an embodiment of the present invention. FIGS. 3 and 4 are discussed simultaneously to describe operations relating to an embodiment of the present invention. Region 499 (cross-hatched), at the far left of timing diagram 400, comprises an undefined, e.g., a "do not care" region, wherein any inputs effectively lack significance.

When the enable signal 401 is brought low, all of the domino circuits in chains 301-306 go to their 'precharge' condition. When the enable signals go low and the clocks go low (e.g., through ordinary combinatorial logic), all of the NFET clocked cutoff devices are off and all PFET clocked precharge devices turn 'on.' The dynamic nodes all go 'high' and are sustained in that 'high' condition with 109 (FIG. 1A). When the 'enable' signal goes low, each of the six clock groups Φ00-Φ50 go to the precharge state, where they are kept by latch 109. As shown in FIG. 3, ring oscillator 300 effectively comprises a ring of 60 circuits, e.g., the non-inverting domino chains 301-306. Positive feedback unconditionally forces ring 300 to a state wherein its outputs are all low, in which state it can be latched indefinitely. Latched low, ring 300 effectively comprises a storage element having an even number of inverter stages, which will thus not oscillate.

As the enable signal 401 goes high at rising edge 411, each of the domino circuits of ring 300 is parked in a 'waiting to evaluate' condition with their dynamic nodes latched high, their clock precharge devices (e.g., precharge device 101; FIG. 1A) turned off and their clocked cutoff (e.g., cutoff device 102; FIG. 1A) on. The components of ring 300 comprise domino circuits (e.g., circuits 100, 200; FIG. 1A-1B, FIG. 2A-2B, respectively). Where any single domino circuit of ring 300 evaluates, it forces the next domino circuit of ring 300 into an evaluate state as well. Thus, where any (e.g., single) input thereof turns on, it will cause its associated dynamic nodes to discharge and the output thereof rises high, which comprises a high input to the next stage of ring 300 and begins a domino cascade in ring 300.

The cascade of the domino circuits of ring 300 can be started with the firing of a momentary high pulse to one of the trigger inputs of one of the domino circuits. Trigger pulses can be supplied with any convenient pulse source. For instance, trigger pulses can be supplied to begin oscillation of ring 300 from an external source, in one embodiment, the domino cascade in ring 300 is started with a trigger pulse supplied by trigger generator 322. Pulse generator 322 functions as an edge detector and operates on the rising edge 411 of enable signal 401.

To recap thus far, from undefined region 499, the enable signal 401 is brought low and ring 300 is initialized as all of its domino circuits are precharged. Upon precharging, enable signal 401 is brought high and the domino circuits comprising ring 300 enter a 'ready to evaluate' condition. After a time delay TD that begins with the enable signal 101 going high, pulse generator 388 converts the edge 411 into a trigger pulse 402, which fires the trigger input of domino chain 301. The delay TD between the rising edge 411 of enable signal 401 and the rising edge 412 of the trigger signal 402 corresponds to the delay associated with the operation of a delay chain 325, comprised of stacked inverters 371-388. Significantly, pulse generator 388 is external to the ring 300; it does not comprise a component of the ring itself. In fact, in other embodiments triggering is externally supplied to circuit 300. Thus, the ring 300 is effectively self-untriggered.

Stacked inverters are described in co-pending U.S. patent application Ser. No. 10/864,271 by Robert P. Masleid, et al. and assigned to the assignee of the present invention, which is incorporated herein by reference as background material. Stacked inverters can be considered logically as simply inverters. With respect to their operational performance however, stacked inverters function with twice the input capacitance and half of the output drive capacity of non-stacked inverters. Thus, stacked inverters comprise relatively slow circuits. While relatively inefficient for signal propagation, chained inverters excel at introducing delay.

The chain of 18 stacked inverters 371-388 thus efficiently functions as a delay chain 325. The first delay chain 325, shown in an articulated configuration, is logically non-inverting because each of the stacked inverters therein are paired with another. Delay chain 325 helps to set the inhibit-to-evaluate margin delay associated with ring 300. The output, of segment 325, e.g., of stacked inverter 388, enables logic gate 328 and is supplied to a second delay chain 327, e.g., at the input of stacked inverter 389. The second delay chain 327 functions as a trigger on-enable pulse generating unit and determines the actual width of the trigger pulse. Upon the input of delay chain 327, e.g., at the output of stacked inverter 388, the enabled logic gate 328 fires a trigger pulse to the trigger input of domino chain 301, which is parked at that time in its 'waiting to evaluate' condition. The pulse ends upon the output of delay chain 327.

Other triggering schemes are used in other embodiments. In another embodiment, pulse trigger 322 comprises another circuit that imparts an effective inhibit-to-evaluate margin delay function and/or another trigger-on-enable pulse generation function. In yet another embodiment, trigger pulses are provided externally. Importantly, the ring 300 is effectively self-untriggered. Significantly, pulse generation is external to the ring 300; it does not arise from a component of the ring itself.

At this point, all domino chains of ring 300, e.g., domino chains 301-306, are parked in their 'waiting to evaluate' condition. When a domino circuit in a 'waiting to evaluate' condition is triggered, that domino circuit performs its evaluate function. Thus, upon triggering domino chain 301, the dynamic nodes of its constituent domino circuits discharge and its output rises high. In a sense, the first domino (e.g., domino chain 301) of ring 300 "falls" and starts oscillation therein as follows. As domino chain 301 so falls, its high output is fed to the input 'a' of domino chain 302, which is thus forced to evaluate as well. When domino chain 302 evaluates, e.g., when "the next domino falls" in ring 300, its output rises high.

The output of domino chain 302 is fed to input 'a' of domino chain 303, e.g., the "next" domino chain in ring 300. Thus, domino chain 303 is forced to evaluate, whereupon its output rises high. Yet another domino of ring 300 falls. The output of domino chain 303 is fed to input 'a' of domino chain 304, e.g., the next domino chain in ring 300. Thus, domino chain 304 is forced to evaluate, whereupon its output rises high. The output of domino chain 304 is fed to input 'a' of domino chain 305, which is thus forced to evaluate, whereupon its output rises high.

The output of domino chain 305 is fed to input 'a' of domino chain 306, which is thus forced to evaluate, whereupon its output rises high. All of the dominos of ring 300 have thus fallen. The output of domino chain 306 is fed to the input 'a' of domino chain 301, completing a first domino cascade in ring 300. Further, the output of domino chain 305 is buffered by inverter 377. The output of inverter 377 comprises the output of ring 300.

The sequence of operation in ring 300 can be synopsized as follows. In undefined region 499, inputs to ring 300 lacked significance. Upon initialization 498, the enable signal 401 went low. All domino circuits of ring 300 thus went to their precharge condition and their outputs went low. When the enable signal 401 went high, all domino circuits of ring 300 went to their ready-to-evaluate condition and waited for a trigger. Upon firing the trigger pulse, the first of the domino circuits of ring 300 falls, e.g., domino chain 301 evaluates and causes the other domino circuits of ring 300 to, in succession, evaluate and cause the next domino chain in the ring to evaluate.

More specifically, the sequence of operation in ring 300 can be described as follows thus far. The rising edge 412 of trigger pulse 402 causes output 00 (e.g., of the first domino circuit of ten-domino circuit chain 301) to rise high, which causes the next nine outputs 01-09 to rise high. The rise of output 09 in turn causes the domino circuits comprising the next domino chain in ring 300 to fall. Thus outputs 10-19 rise. These in turn cause the next domino circuits comprising the next domino chain in ring 300 to fall. Thus outputs 20-29 rise. These in rum cause the next domino circuits comprising the next domino chain in ring 300 to fell. Thus outputs 30-39 rise. These in turn cause the next domino circuits comprising the next domino chain in ring 300 to fall. Thus outputs 40-49 rise. These in turn cause the next domino circuits comprising the next domino chain in ring 300 to fall. Thus outputs 50-59 rise.

At this point, all the dominos of ring 300 have fallen. All outputs are high, and an even number of inversions has occurred around loop 300, which is thus again in a stable state, in which it can be latched. No oscillating action has yet occurred in ring 300. However, the outputs of each of domino chains 301-306 is periodically tapped and fed back to the clocking gate associated with one of the domino chains at an "earlier" position in tins 300. Thus, after a group of domino circuits (e.g., domino chain 301, etc.) has fallen, its output is fed back with a clock to a "previous" set of domino circuits.

The output of domino chain 301 for instance is fed back to the inhibit and initialize gate 363 associated with domino chain 306. The output of domino chain 306 for instance is fed back to the gate 363 associated with domino chain 305. The output of domino chain 305 for instance is fed back to the gate 363 associated with domino chain 304. The output of domino chain 304 for instance is fed back to the gate 363 associated with domino chain 303. The output of domino chain 303 for instance is fed back to the gate 363 associated with domino chain 302. And in the present exemplary implementation, the output of domino chain 302 is fed back to the inhibit and initialize gate 363 associated with domino chain 301.

Thus, after one group of dominos (e.g., domino chain 301) has fallen, its output is used to feed back to a gate 363 associated with a previous set of dominos (e.g., domino chain 306), which upon a clock thereto puts that associated set back into a precharge condition. Upon precharging that associated, domino set, the clock condition of the first group (e.g., domino chain 301) is switched back to a ready to evaluate condition. The rate of signal propagation around ring 300 is related to (e.g., dependent on, proportional to, etc.) the forward evaluate time of the ring, e.g., the time it takes to evaluate an input, e.g., to generate an output corresponding thereto. However, before the evaluation "returns" to the same point in ring 300, another component circuit of the ring has already precharged the domino circuit at that point.

Thus, the domino chains' fall and the evaluating continues indefinitely around the ring, substantially unabated, establishing an oscillation therein. Importantly, ring 300 thus comprises an effective ring oscillator having an even number of inverting stages, each comprising dynamic circuits. Further, ring 300 uses effectively self-resetting logic signals to perpetuate its oscillation. The outputs of each component domino chain of ring 300 feed back to a stage at some point previous in the ring (e.g., one or more positions earlier). Thus, the ring 300 is effectively self-untriggered. In the present embodiment, the outputs of each component domino chain offing 300 feed back one stage earlier in ring 300. However, ring 300 can be implemented with the outputs of each of its component domino chains fed back to a stage at any point selected that is previous in the ring to the outputting stage.

Thus, the trigger pulse effectively causes outputs 00-09 to fall low. This effect is perpetuated for outputs 20-29, etc. through 50-59. The output 29 is brought back up to the Φ10 clock (e.g., input to gate 363 therewith) and is used to bring Φ10 low. (In a similar way, output 19 has a similar affect with Φ00, etc.) The Φ10 then remains low until output 29 is precharged, at which point Φ10 returns to a high condition.

Importantly, oscillating ring 300 has an even number of inverting stages and uses logic signals of components thereof to reset stages situated earlier in the ring, without additional pulse generators. Outputs of the stages comprising ring 300 are fed back to previous stages in the ring. While ring oscillator 300 can conveniently be triggered with an edge detector, pulse generator, etc. represented by pulse generator 388, it should be appreciated that ring oscillator can function without edge detecting and other pulse generators; even operating with externally provided triggering. Ring oscillator 300 comprises a dynamic oscillator that uses a level sensitive completion signal to precharge an upstream stage. In implementations using predominantly PFET precharge devices, the precharge condition described above is analogous to a 'reset' condition.

Considering a stage N of ring 300 whose output comprises a completion signal, its output can be fed back an indefinite number of stages J to a stage that responds to the level of the feedback signal, in contrast to its edge. No trigger pulse is needed to sustain oscillation of ring 300 once if is triggered. Once enabled, ring 300 can be triggered by pulse generator 388 or externally, e.g., with a user supplied trigger pulse, importantly, no particular trigger circuit is required for the oscillation, of ring 300 within its dynamic circuits.

Exemplary Low Voltage Dynamic Ring Oscillator

Figure 5B:
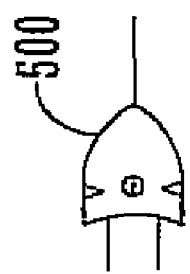
FIG. 5B depicts a representation of another exemplary N-footed domino circuit, according to an embodiment of the present invention.
Figure 5A:
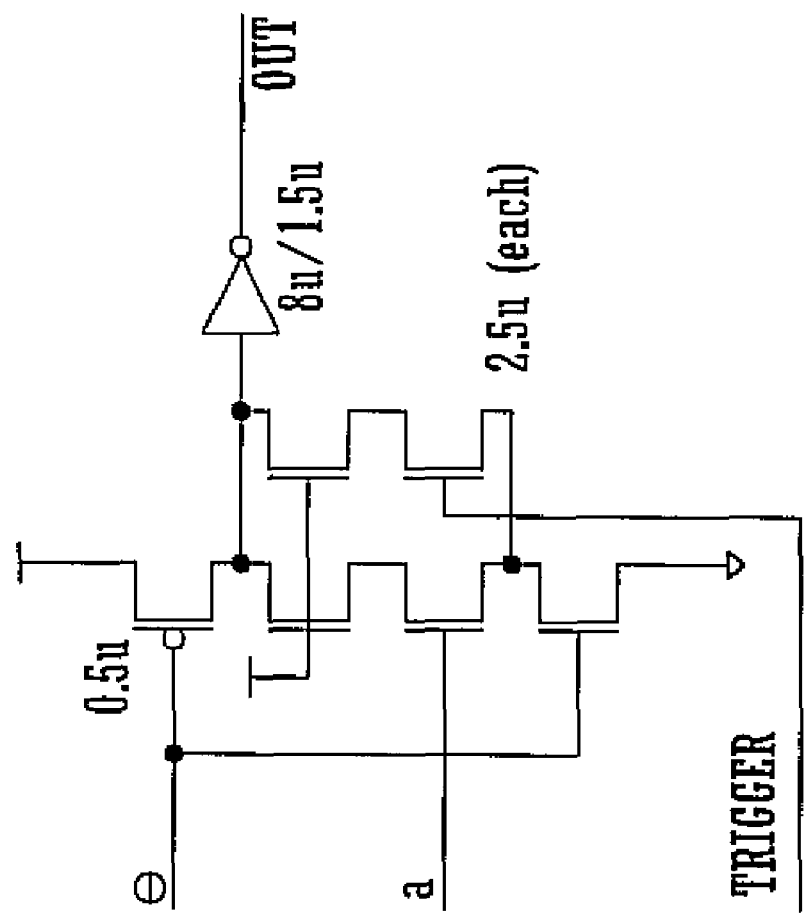
FIG. 5A depicts another exemplary N-footed domino circuit diagram, according to an embodiment of the present invention.

FIG. 5A depicts another exemplary N-footed domino circuit 500, according to an embodiment of the present invention. Circuit 300 (FIG. 3) above relates to domino ring oscillators that are functional for zero frequency (e.g., DC) and/or low frequency operation. Its component circuits thus use half latch 109 (FIG. 1A) to help stabilize its operational states. Domino circuit 500, in contrast, uses no such latching circuit and is operated as an oscillator, suitable for very low voltage (e.g., ultra low minimum voltage or 'Vmin') operation. Otherwise, its operation is similar to (e.g., analogous to, etc) that of domino circuit 100, described above (with reference to FIGS. 1A and 1B).

FIG. 5B depicts a representation of exemplary N-footed domino circuit 500, according to an embodiment of the present invention. In FIG. 5B, for simplicity in describing exemplary embodiments below, domino circuit 500 (as described with reference to FIG. 5A) is depicted in a simplified symbolism as a logic unit having the two inputs 'a' and 'trigger' and two clock marks, one clock for precharge and the other for clocked cutoff.

Figure 6A:
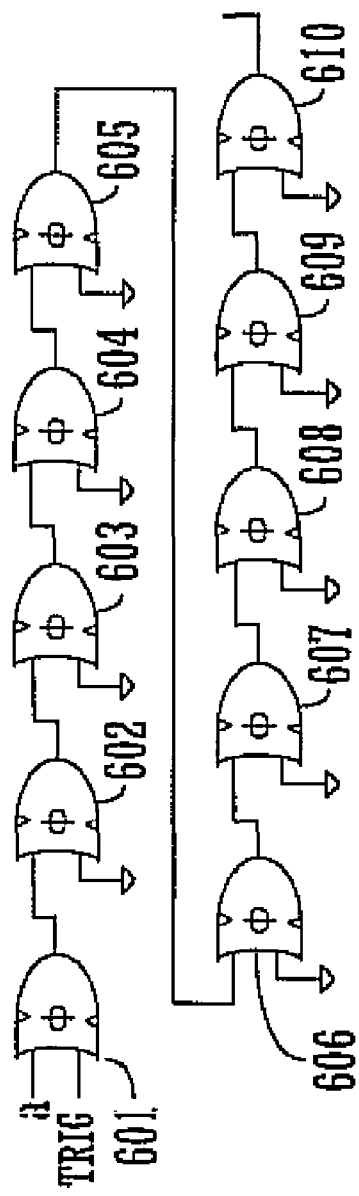
FIG. 6A depicts an exemplary chain of other N-domino circuits, according to an embodiment of the present invention.

FIG. 6A depicts an exemplary chain 600 often N-domino circuits 601-610, according to an embodiment of the present invention. As with domino chain 200 discussed above (FIG. 2A, 2B) other numbers (e.g., numbers beside 10) of domino circuits can be so chained. In the present embodiment, the ten domino circuits 601-609, all of them substantially identical to the domino circuit 500 (FIGS. 5A & 5B), are effectively connected together in a simple series configuration to form chain 600.

The input 'a' and the trigger signal are available to domino circuit 601, e.g., the first domino circuit in chain 600. The output of domino circuit 601 effectively comprises the analog of the input 'a' for the subsequent, domino circuit 602 in chain 600. The trigger input for domino circuit 602 however is effectively disabled e.g., with grounding, as are the other domino circuits 603-610 downstream therefrom. The precharge and cutoff clocks are fed to all domino circuits 601-610 in parallel. Thus, the domino circuits 601-610 are clocked effectively simultaneously.

Figure 6B:
FIG. 6B depicts a representation of another exemplary chain of other N-domino circuits, according to an embodiment of the present invention.

FIG. 6B depicts a representation of exemplary chain 600 of N-domino circuits, according to an embodiment of the present invention. In FIG. 26, for simplicity in describing exemplary embodiments below, domino circuit chain 600 (as described with reference to FIG. 6A) is depicted in a simplified symbolism as a ten unit (e.g., series) logic element having the two inputs 'a' and 'trigger' and two clock marks, one clock for precharge and the other for foot cutoff.

As with the domino circuit 200 discussed above (FIG. 2A, 2B), each domino circuit stage (e.g., domino circuits 601-609) of chain 600 has a certain delay associated with its evaluation operation, e.g., with outputting a logic response based upon receiving an input. For simplicity and brevity in discussing this delay herein (as above), it is convenient to consider the exemplary delay associated with a single domino circuit in chain 600 as comprising one delay unit of time.

The delay associated with a signal propagating through chain 600 is greater than a single delay unit. In the present implementation wherein chain 600 comprises ten individual domino circuits 601-609 in series, its overall chain delay effectively exaggerates the forward evaluate delay associated with a single one of its component domino circuit by a factor of ten. The precharge time (and foot cutoff) time however is the same for chain 600 as for its individual domino circuit components 601-610, because the precharge (and cutoff signals) are delivered in parallel thereto.

With the exception of the functionality attributed to half latch 109 (FIG. 1A) above, and the suitability of circuits 500 and 600 for very low operating voltages, the operation of circuits 500 and 600 are substantially similar to those described above with reference to FIGS. 1A, 1B and 2A, 2B, relating to circuits 100 and 200, respectively and operate in a manner that is substantially analogous to the operation thereof, as described above.

Figure 7:
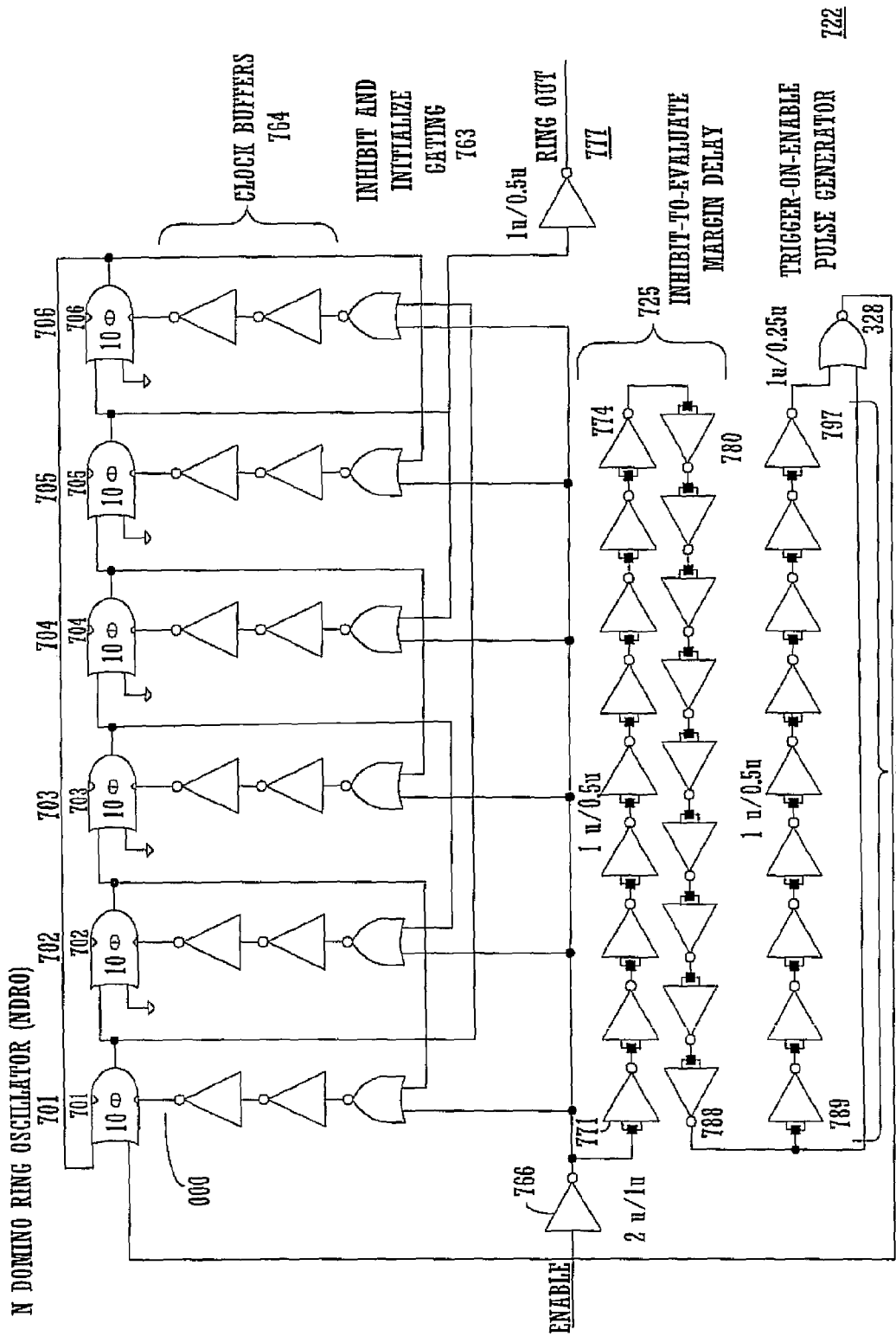
FIG. 7 depicts another exemplary N-Domino ring oscillator, according to an embodiment of the present invention.

FIG. 7 depicts an exemplary N-Domino ring oscillator 700, according to an embodiment, of the present invention. Domino ring oscillator 700 is suitable for very low voltage operation and effectively comprises a ring of six domino chains 701-706. Other numbers (e.g., numbers beside 6) of domino chains 700 can be so chained. In the present embodiment, the six domino chains 701-706, all of them substantially identical to the domino chain 600 (FIGS. 6A & 6B), are effectively connected together in an simple ring configuration to form oscillating domino ring 700. The operating frequency of ring 700 can be monitored at any of its outputs. In the present implementation, inverter 777 buffers the output of domino chain 705 to comprise the output of ring 700. Beside its suitability for low voltage operation, ring 700 is substantially similar in structure, function and operation to that described above (e.g. FIG. 3, 4) relating to the operation of ring oscillator 300.

Exemplary P-Footed Domino Circuit

FIG. 8A depicts a diagram of an exemplary P-footed domino circuit 800, according to an embodiment of the present invention. In contrast to the N-footed domino circuits described above, the operating frequency of P-footed domino circuit 800 is dominated by PFET attributes, which is substantially complimentary to the NFET dominated operating frequencies relating to those N-footed domino circuits. P-footed domino circuit 800 comprises a substantially complimentary circuit to the N-footed domino circuits described above (e.g., N-footed domino circuit 100; FIG. 1A, 1B), and operates in an analogous manner, substantially complimentary to the operation thereof as described above. P-footed domino circuit 800 has a P-type cutoff device 802.

DC/Low Frequency and Low Voltage P-Domino Functions Compared

Half latch 809 or a similarly functional latch functions to latch the buffered output of circuit 800, e.g., at the output of inverter 806, to reinforce a pre-discharge state of circuit 800, which is analogous to and substantially complimentary to the operation of latch 109 in N-domino circuit 100 (FIG. 1A). Half latch 809 promotes the stability of circuit 800 and thus supports DC and low frequency operation thereof. However, P-domino circuit 800 can effectively be tendered suitable for very low voltage operation by removing (e.g., not having disposed therein, disabling, operating without, etc.) of the latch functionality 809.

FIG. 8B depicts a representation of exemplary P-footed domino circuit 800, according to an embodiment of the present invention. In FIG. 8B, for simplicity in describing exemplary embodiments below, domino circuit 800 (as described with reference to FIG. 8A) is depicted in a simplified symbolism as a logic unit having the two inputs 'a' and 'trigger' and two clock marks, one clock for precharge and the other for foot cutoff.

Exemplary P-Footed Domino Circuit Chain

Figures 9A, 9B:
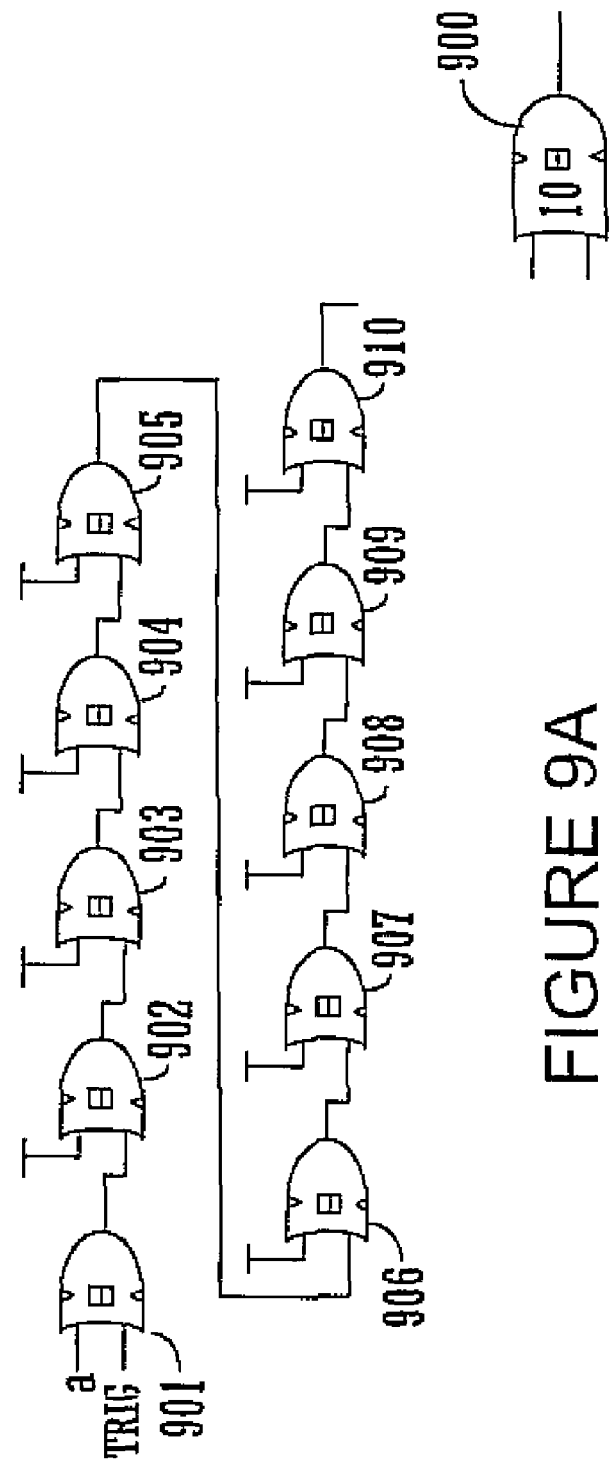
FIG. 9A depicts an exemplary chain of P-domino circuits, according to an embodiment of the present invention.
FIG. 9B also depicts a representation of an exemplary chain of P-domino circuits, according to an embodiment of the present invention.

FIG. 9A depicts an exemplary chain 900 of ten P-domino circuits 901-910, according to an embodiment of the present invention. Other numbers (e.g., numbers beside 10) of P-domino circuits can be so chained. In the present embodiment, the ten P-domino circuits 901-910, all of them substantially identical to the P-footed domino circuit 800 (FIGS. 8A & 8B), are effectively connected together in a simple series configuration to form chain 900. P-footed domino chain 900 comprises a complimentary circuit to the N-footed domino chains described above (e.g., N-footed domino circuit 200; FIG. 2A, 2B), and operates in a manner substantially complimentary to the operation thereof as described above.

As with the N-domino chains described above, the input 'a' and the trigger signal to P-domino chain 900 are available to domino circuit 901, e.g., the first domino circuit in chain 900. The output of domino circuit 901 effectively comprises the analog of the input 'a' for the subsequent domino circuit 902 in chain 900. The trigger input for domino circuit 902 however is effectively disabled e.g., by grounding, as it is like the other domino circuits 903-910 downstream therefrom. The pre-discharge and cutoff clocks are fed to all domino circuits 901-910 in parallel. Thus, the domino circuits 901-910 are effectively clocked simultaneously.

Each domino circuit stage (e.g., domino circuits 901-910) of chain 900 has a certain delay associated with its evaluation operation, e.g., with outputting a logic response based upon receiving an input. It is convenient to consider the exemplary delay associated with a single domino circuit in chain 900 as comprising one delay unit of time.

As with the N-domino chains described above, the delay associated with a signal propagating through P-Domino chain 900 is greater than a single delay unit. In the present implementation wherein chain 900 comprises ten individual domino circuits 901-910 in series, its overall chain delay effectively exaggerates the forward evaluate delay associated with a single one of its component domino circuit by a factor of ten. The pre-discharge time (and foot cutoff) time however is the same for the pre-discharge time of P-domino chain 900 as for its individual domino circuit components 901-910, because the pre-discharge (and cutoff signals) are delivered in parallel thereto.

With reference again to FIG. 8A, a pre-discharge (e.g., in contrast and/or complimentary to the precharge state characterizing the N-footed domino circuits, chains and ring described above) occurs when the clocked cutoff PFET device 802 is turned off, as when the clock is high, effectively complimentary to the precharge operation of the N-footed domino chains described above. With the pre-discharge PFET 802 off, inputs are effectively insignificant because their potential paths are in a high impedance state. The high clock at the NFET device 801 turns it on. This charges the dynamic element 803. The half latch 809 functions to reinforce the pre-discharge condition. Thus, if the clock signal disappears, the domino circuit 800 remains in a pre-discharge condition. For low voltage operations, this feature is dispensed with in one embodiment.

FIG. 9B depicts a representation of exemplary chain 900 of P-domino circuits, according to an embodiment of the present invention. In FIG. 9B, for simplicity in describing exemplary embodiments below, domino circuit chain 900 (as described with reference to FIG. 9A) is depicted in a simplified symbolism as a ten unit (e.g., series) logic element having the two inputs 'a' and 'trigger' and two clock marks, one clock for precharge and the other for clocked cutoff.

Exemplary P-Domino Ring Oscillator

Figure 10:
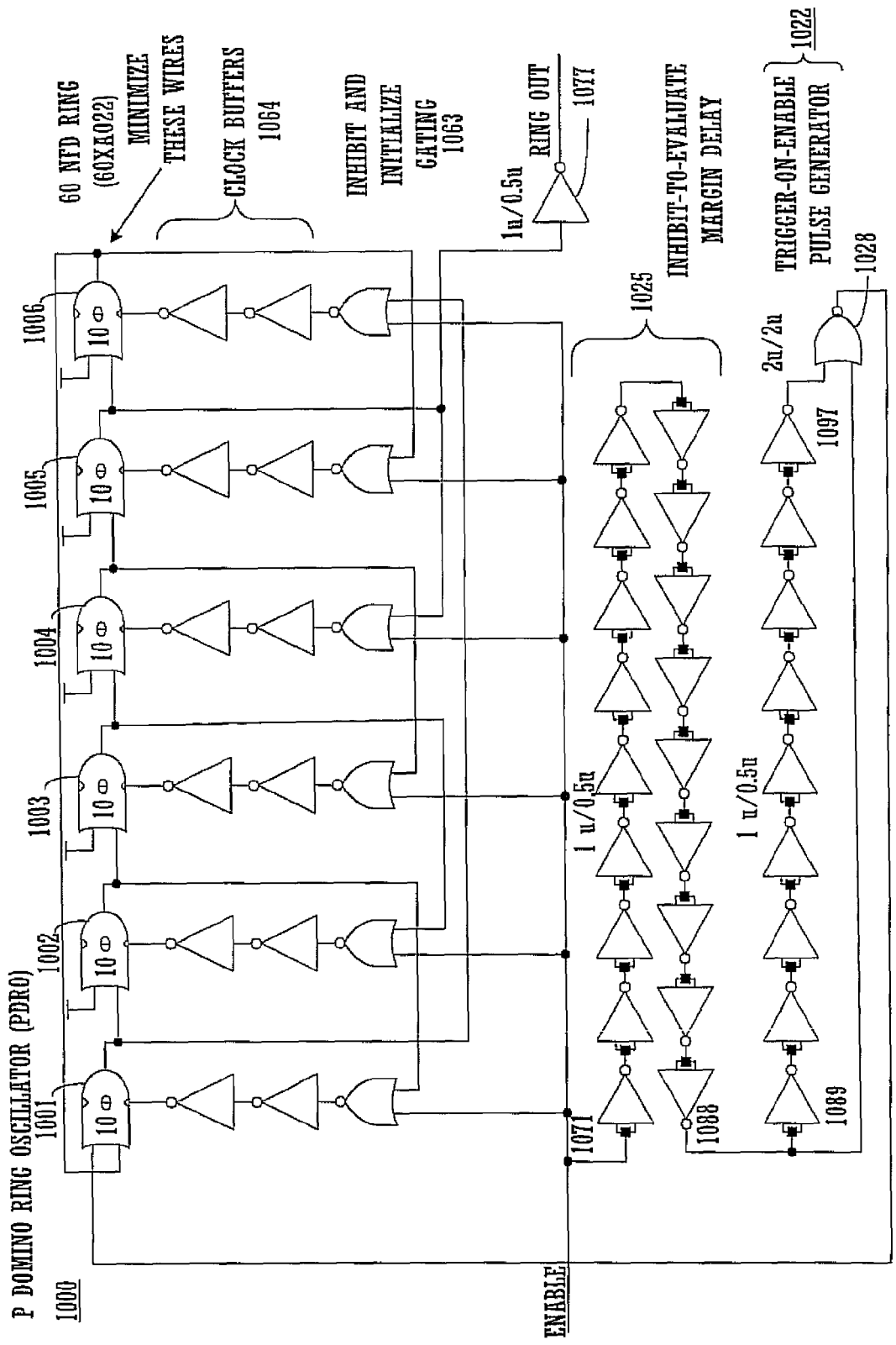
FIG. 10 depicts an exemplary P-Domino ring oscillator, according to an embodiment of the present invention.

FIG. 10 depicts an exemplary P-Domino ring oscillator 1000, according to an embodiment of the present invention. P-Domino ring oscillator 1000 effectively comprises a ring of six domino chains 1001-1006. Other numbers (e.g., numbers beside 6) of domino chains 1000 can be so chained. In the present embodiment, the six domino chains 1001-1006, all of them substantially identical to the domino chain 900 (FIGS. 9A & 9B), are effectively connected together in an simple ring configuration to form oscillating P-domino ring 1000. The operating frequency of ring 1000 can be monitored at any of its outputs. In the present implementation, inverter 1077 buffers the output of domino chain 1005 to comprise the output of ring 1000.

In the present embodiment, the ten P-domino chains 1001-1010, all of them substantially identical to the P-footed domino circuit 900 (FIGS. 9A & 9B), are effectively connected together in a simple series configuration to form P-footed domino ring 1000. P-footed domino ring 1000 comprises a complimentary circuit to the N-footed domino rings described above (e.g., N-footed domino ring 300; FIG. 3), and operates in a manner substantially complimentary to the operation thereof as described above, in the present implementation depicted, P-footed domino ring comprises P-footed domino circuits that can be latched in their pre-discharge condition, and is thus well suited for DC and low frequency operation. In one embodiment, P-footed domino ring 1000 comprises P-footed domino circuits that are configured without half latches and is well suited for low voltage operation.

Exemplary P-Domino Ring Timing Sequence

Figure 11:
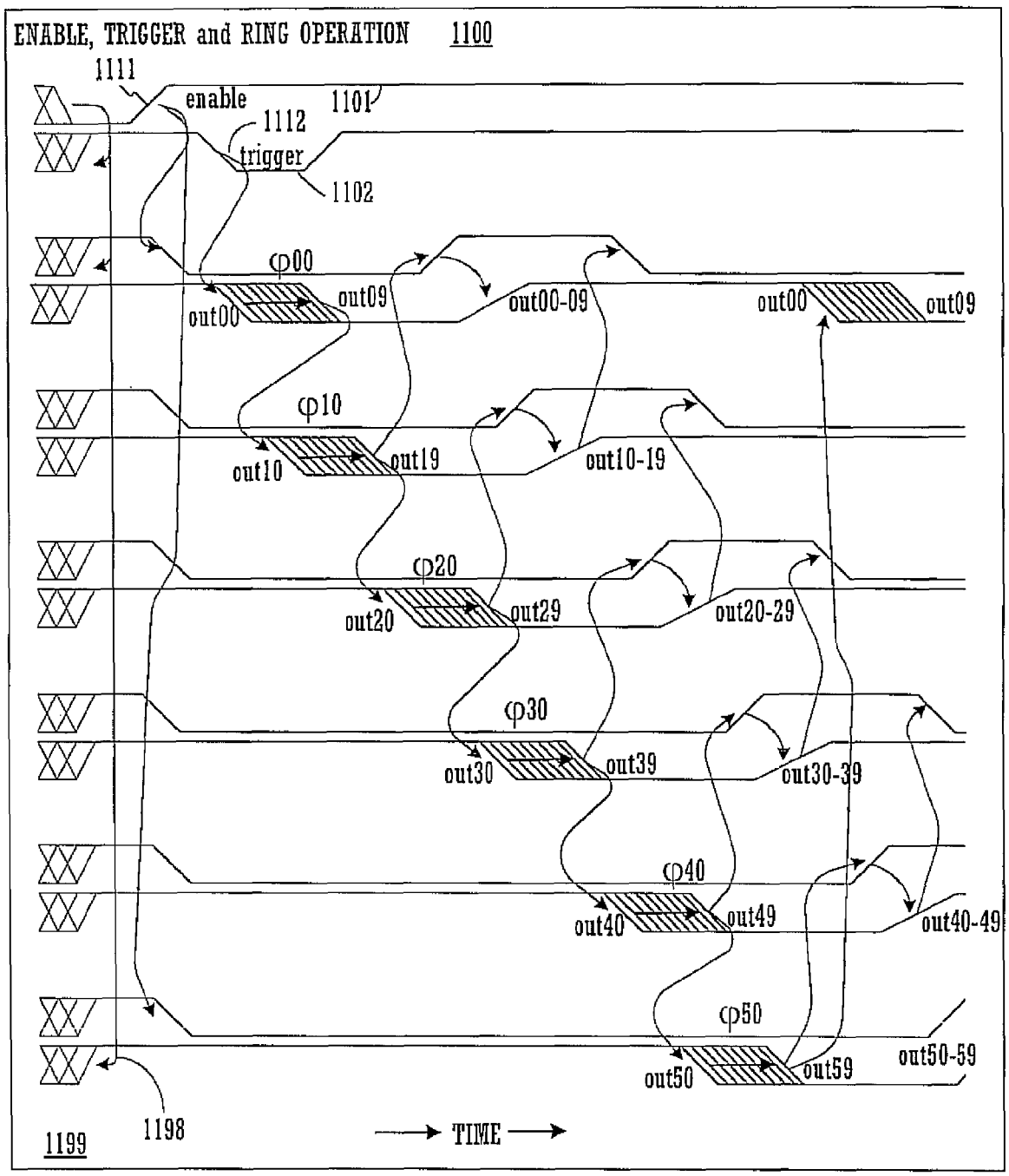
FIG. 11 depicts an exemplary timing sequence for a P-Domino ring oscillator, according to an embodiment of the present invention.

FIG. 11 depicts an exemplary timing sequence 1100 for a P-Domino ring oscillator, according to an embodiment of the present invention. FIGS. 10 and 11 are discussed simultaneously to describe operations relating to an embodiment of the present invention. P-footed domino ring 1000 comprises a complimentary circuit to the N-footed domino rings described above and operates in a manner substantially complimentary to the operation thereof as described above. Thus, timing diagram 1100 is substantially complimentary to timing diagram 400 (FIG. 4), which relates to the operation of the N-Domino rings.

When the enable signal 1101 is brought low, all of the P-domino circuits in chains 1001-1006 go to their 'pre-discharge' condition. When the enable signals go low and the clocks go high (e.g., through ordinary combinatorial logic), all of the PFET clocked cutoff devices turn 'off' and all NFET pre-discharge devices turn 'on.' The dynamic nodes all go 'low' and are sustained in that condition with half latch 809 (FIG. 8A), e.g., except in embodiments configured for low voltage operation (e.g., in contrast to DC/low frequency operation). When the 'enable' signal goes low, each of the six clock groups Φ00-Φ50 go to the pre-discharge state. As shown in FIG. 10, ring oscillator 1000 effectively comprises a ring of 60 inverters, e.g., the inverting domino chains 1001-1006 (each having ten inverting domino circuits). Positive feedback unconditionally forces ring 1000 to a state wherein its outputs are all low, in which state it can be latched indefinitely. Latched low, P-domino ring 1000 effectively comprises a storage element having an even number of inverter stages, which will thus not oscillate.

As the enable signal 1101 goes high at rising edge 1111, each of the domino circuits of ring 300 is parked in a 'waiting to evaluate' condition with their dynamic nodes latched low, their clock pre-discharge devices tamed off and their clocked cutoff on. The components of ring 1000 comprise domino circuits (e.g., circuits 800, 900; FIG. 8A-8B, FIG. 9A-9B, respectively). Where any single domino circuit of ring 1000 evaluates, it forces the next domino circuit of ring 1000 into an evaluate state as well. Thus, where any (e.g., single) input thereof turns off, it will cause its associated dynamic nodes to charge and the output thereof falls low, which comprises a low input to the next stage of ring 1000 and begins a domino cascade in ring 1000.

The cascade of the domino circuits of ring 1000 can be started with the firing of a momentary low pulse to one of the trigger inputs of one of the domino circuits. As discussed above in relation to the N-Domino circuits, trigger pulses can be supplied with any convenient pulse source. For instance, trigger pulses can be supplied to begin oscillation of ring 1000 from an external source. In one embodiment, the domino cascade in ring 1000 is started with a trigger pulse supplied by trigger generator 1022. Pulse generator 1022 functions as an edge detector and operates on the rising edge 1111 of enable signal 1101.

To recap thus far, from undefined, region 1199, the enable signal 1101 is brought low and ring 1000 is initialized as all of its P-domino circuits are pre-discharged. Upon pre-discharging, enable signal 1101 is brought high and the domino circuits comprising ring 1000 enter a 'ready to evaluate' condition. After a time delay TD that begins with the enable signal 1101 going high, pulse generator 1088 converts the edge 1101 into a trigger pulse 1102, which fires the trigger input of P-domino chain 1001. The delay TD between the rising edge 1111 of enable signal 1101 and the falling edge 1112 of the trigger signal 1102 corresponds to the delay associated with the operation of a delay chain 1025, comprised of stacked inverters 1071-1088, the operation of which are analogous to and substantially complimentary to the operation of delay chain 325 described above (FIG. 3, 4).

Upon the output of segment 1025, e.g., at the output of stacked inverter 1088, the enabled logic gate 1028 fires a trigger pulse 1102 to the trigger input of domino chain 1001, which is parked at that time in its 'waiting to evaluate' condition. Other triggering schemes are used in other embodiments. In another embodiment, pulse trigger 1022 comprises another circuit that imparts an effective inhibit-to-evaluate margin delay function and/or another trigger-on-enable pulse generation function. In yet another embodiment, trigger pulses are provided externally.

At this point, all domino chains of ring 1000, e.g., domino chains 1001-1006, are parked in their 'waiting to evaluate' condition. When a domino circuit in a 'waiting to evaluate' condition is triggered, that domino circuit performs its evaluate function. Thus, upon triggering domino chain 1001, the dynamic nodes of its constituent domino circuits charge and its output falls low. In a sense, the first domino (e.g., domino chain 1001) of ring 1000 "falls" and starts oscillation therein as follows. As domino chain 1001 so falls, its low output is fed back to the input 'a' of domino chain 1002, which is thus forced to evaluate as well.

When domino chain 1002 evaluates, e.g., when "the next domino falls" in ring 1000, its output falls low. The output of domino chain 1002 is fed to input 'a' of domino chain 1003, e.g., the "next" domino chain in ring 1000. Thus, domino chain 1003 is forced to evaluate, whereupon its output falls low. Yet another domino of ring 1000 falls. Analogous to the action described above in relation to the operation of N-domino ring 300 (FIG. 3, 4), this action continues around ring 1000 until all of the dominos of ring 1000 have thus fallen. The output of domino chain 1006 is fed to the input 'a' of domino chain 1001, completing a first domino cascade in ring 1000. Further, the output of domino chain 1005 is buffered by inverter 1077. The output of inverter 1077 comprises the output of ring 1000.

The sequence of operation in ring 1000 can be synopsized as follows. In undefined region 1199, inputs to ring 1000 lacked significance. Upon initialization 1198, the enable signal 1101 went low. All domino circuits of ring 1100 thus went, to their pre-discharge condition and their outputs went high. When the enable signal 1101 went high, all domino circuits of ring 1000 went to their ready-to-evaluate condition and waited for a trigger. Upon firing the trigger pulse 1102, the first of the domino circuits of ring 1000 falls, e.g., domino chain 1001 evaluates and causes the other domino circuits of ring 1000 to, in succession, evaluate and cause the next domino chain in the ring to evaluate.

More specifically, the sequence of operation in ring 1000 can be described as follows thus far. The falling edge 1112 of trigger pulse 1102 causes output 00 (e.g., of the first domino circuit of ten-domino circuit chain 1001) to fall low, which causes the next nine outputs 01-09 to fall low. The fall of output 09 in turn causes the domino circuits comprising the next domino chain in ring 1000 to fall. Thus outputs 10-19 fall. These in turn cause the next domino circuits comprising the next domino chain in ring 1000 to fall. Thus outputs 20-29 fall. These in turn cause the next domino circuits comprising the next domino chain in ring 1000 to fall. Thus outputs 30-39 fall. These in turn cause the next domino circuits comprising the next domino chain in ring 1000 to fall. Thus outputs 40-49 fall. These in turn cause the next domino circuits comprising the next domino chain in ring 300 to fall. Thus outputs 50-59 fall.

At this point, all the dominos of ring 1000 have fallen. All outputs are low, and an even number of inversions has occurred around loop 1000, which is thus again in a stable state, in which it can be latched e.g. for DC/low frequency operation (but not for low voltage operation). No oscillating action has yet occurred in ring 1000. However, the outputs of each of domino chains 1001-1006 is periodically tapped and fed back to the clocking gate 1063 associated with one of the domino chains at an "earlier" position in ring 1000. Thus, after a group of domino circuits (e.g., domino chain 1001, etc.) has fallen, its output is fed back with a clock to a "previous" set of domino circuits.

The output of domino chain 1001 for instance is fed back to the inhibit and initialize gate 1063 associated with domino chain 1006. The output of domino chain 1006 for instance is fed back to the gate 1063 associated, with domino chain 1005. The output of domino chain 1005 for instance is fed back to the gate 1063 associated with domino chain 1004. The output of domino chain 1004 for instance is fed back to the gate 1063 associated with domino chain 1003. The output of domino chain 1003 for instance is fed back to the gate 1063 associated with domino chain 1002. And in the present exemplary implementation, the output of domino chain 1002 is fed back to the inhibit and initialize gate 1063 associated with domino chain 1001.

Thus, after one group of dominos (e.g., domino chain 1001) has fallen, its output is used to feed back to a gate 1063 associated with a previous set of dominos (e.g., domino chain 1006), which upon a clock thereto puts that associated set back into a pre-discharge condition. Upon pre-discharging that associated domino set, the clock condition of the first group (e.g., domino chain 1001) is switched back to a ready-to-evaluate condition. The rate of signal propagation around ring 1000 is related to (e.g., dependent on, proportional to, etc.) the forward evaluate time of the ring, e.g., the time it takes to evaluate an input, e.g., to generate an output corresponding thereto. However, before the evaluation "returns" to the same point in ring 1000, another component circuit of the ring has already pre-discharged the domino circuit at that point.

Thus, the domino chains' fall and the evaluating continues indefinitely around the ring, substantially unabated, establishing an oscillation therein. Importantly, ring 1000 thus comprises an effective ring oscillator having an even number of inverting stages, each comprising dynamic circuits. Further, ring 1000 uses effectively self-resetting logic-signals to perpetuate its oscillation. The outputs of each component domino chain of ring 1000 feed back to a stage at some point previous in the ring (e.g., one or more positions earlier). In the present embodiment, the outputs of each component domino chain of ring 1000 feed back one stage earlier in ring 1000. However, ring 1000 can be implemented with the outputs of each of its component domino chains fed back to a stage at any point selected that is previous in the ring to the outputting stage.

Thus, the trigger pulse effectively causes outputs 00-09 to fall low. This effect is perpetuated for outputs 20-29, etc. through 50-59. The output 29 is brought back up to the $\Phi10$ clock (e.g., input to gate 1063 therewith) and is used to bring $\Phi10$ high. (In a similar way, output 19 has a similar affect with $\Phi00$, etc.) The $\Phi10$ then remains high until output 29 is pre-discharged, at which point $\Phi10$ returns to a low condition.

Importantly, like the N-domino rings discussed above, P-domino oscillating ring 1000 has an even number of inverting stages and uses logic signals of components thereof to reset stages situated earlier in the ring, without additional pulse generators. Outputs of the stages comprising ring 1000 are fed back to previous stages in the ring. While ring oscillator 1000 can conveniently be triggered with an edge detector, pulse generator, etc. represented by pulse generator 1088, it should be appreciated that ring oscillator can function without edge detecting and other pulse generators; even operating with externally provided triggering. Ring oscillator 1000 comprises a dynamic oscillator that uses a level sensitive completion signal to precharge an upstream stage. In these implementations using predominantly PFET devices, the predischarge condition is analogous to a 'reset' condition of precharge condition in N-domino circuits.

Considering a stage N of ring 1000 whose output comprises a completion signal, its output can be fed back, an indefinite number of stages J to a stage that responds to the level of the feedback signal in contrast to its edge. No trigger pulse is needed to sustain oscillation of ring 1000 once it is triggered. Once enabled, ring 1000 can be triggered by pulse generator 1088 or externally, e.g., with a user supplied trigger pulse. Importantly however, no particular trigger circuit is required for the oscillation of ring 1000 within its dynamic circuits.

Exemplary Comparison System and Process

The frequency ($F_{DRO}$) of the P-domino and N-domino ring circuits (DRO) described herein effectively comprises the reciprocal of the delay period around the ring. Thus, $$F_{DRO} = 1/\text{Delay Period}_{Ring}$$

(Equation 1). The delay period around the rings described herein has two component delays, one associated with its dynamic stages and the other with its static stages. The dynamic stage delay component will often be significantly longer than the relatively small delay component associated with the static circuits.

The buffer stage (e.g., output inverters 106 & 806; FIGS. 1A & 8A, respectively) is implemented in one embodiment such that it has a significant (e.g., substantial) size with respect to the dynamic stage (e.g., devices 103 & 803; FIGS. 1A & 8A, respectively). In the present embodiment, the buffer stage places a significant load on the relatively slowly switching dynamic stage of the ring and the buffer's large size relative to the dynamic stage switches the dynamic stage readily.

In one embodiment therefore, the most significant portion of delay in the domino circuits described herein is related to (e.g., depends upon, is influenced by, etc.) the time it takes for the active transistor (e.g., FET) devices to discharge their dynamic load. In a predominantly N-domino circuit, the output frequency is thus proportional to the "strength" of its constituent NFET evaluation devices. Likewise, in a predominantly P-domino circuit, the output frequency is proportional to the strength of its constituent PFET evaluation devices. N-domino circuits (e.g., N-domino ring oscillator 300; FIG. 3) also comprise some PFET devices (e.g., PFET 101; FIG. 1A) and vice versa, e.g., complimentarily, P-domino circuits also comprise some NFETs. Thus, the output frequency of an N-domino oscillator is related to the strength of its constituent NFETs in proportion to its constituent PFETs and vice versa.

Figure 12A:
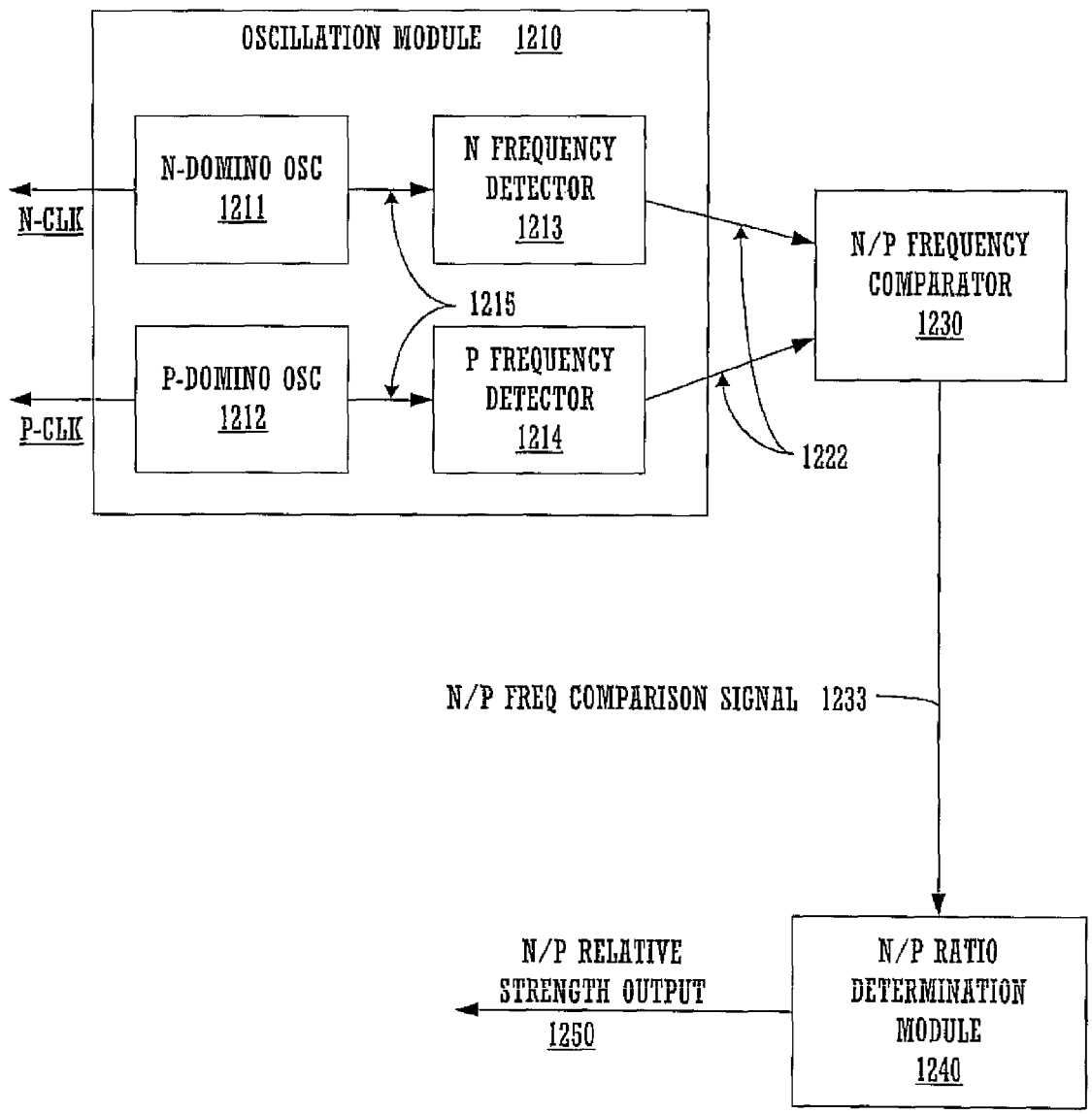
FIG. 12A depicts an exemplary system for effectively determining the relative strengths of constituent P-type and N-type devices, according to an embodiment of the present invention.
Figure 12B:
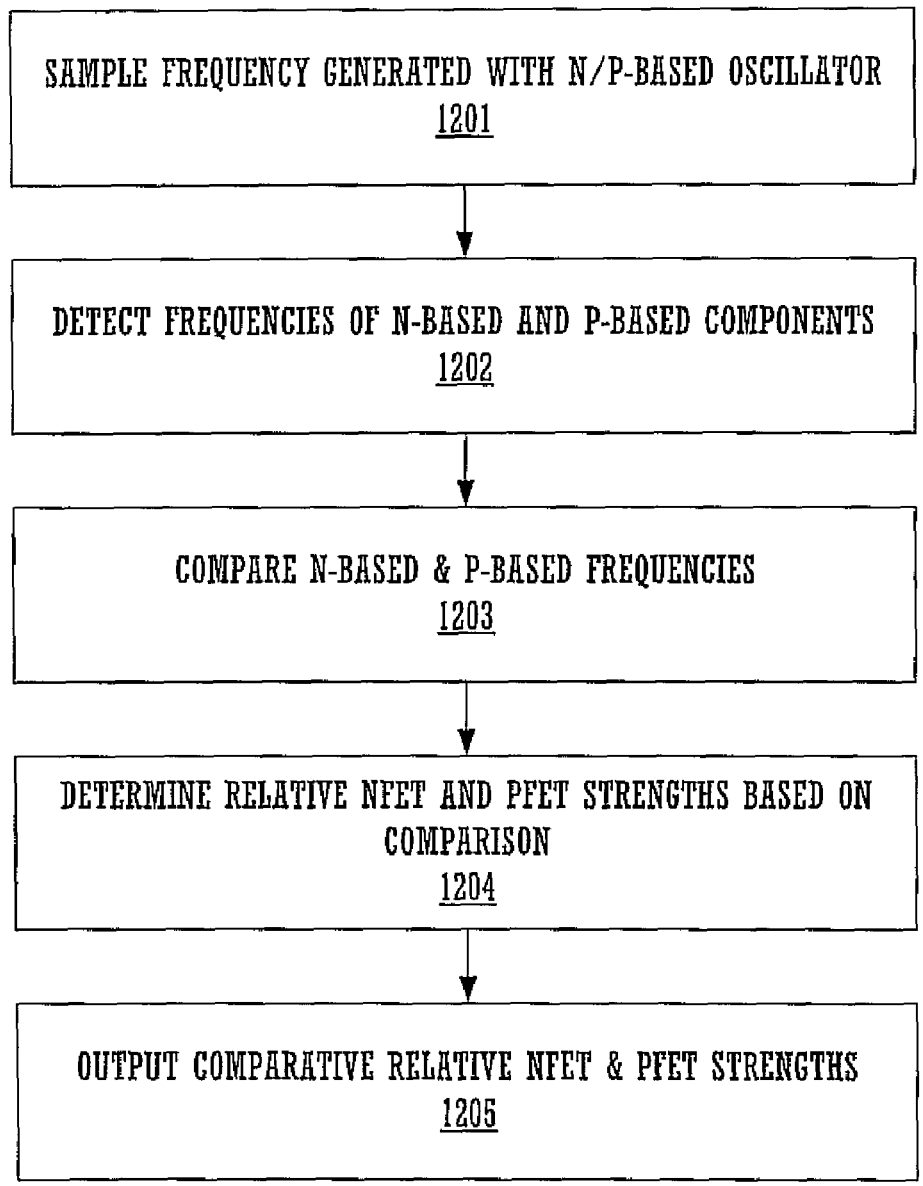
FIG. 12B is a flowchart of a process for effectively determining the relative strengths of constituent P-type and N-type devices, according to an embodiment of the present invention.

FIG. 12A depicts an exemplary system 1200A for effectively determining (e.g., measuring, calculating, ascertaining, etc.) the relative strengths of constituent P-type and N-type devices, according to an embodiment of the present invention. FIG. 12B is a flowchart of a process 1200B for effectively determining the relative strengths of constituent P-type and N-type devices, according to an embodiment of the present invention. For clarity and brevity. FIGS. 12A and 12B are described together.

An oscillating module 1210 comprises a pair of substantially complimentary oscillators, one substantially NFET based and the other substantially PFET based. In one embodiment, oscillator 1211 comprises an N-domino oscillator (e.g., N-ring oscillator 300; FIG. 3). The output of N-domino oscillator 1211 is coupled to an N frequency detector 1213. The output of P-domino oscillator 1212 is coupled to a P frequency detector 1214. The frequency of the oscillating outputs 1222 is related to the relative strengths of the NFET and PFET components of oscillators 1211 and 1212. The frequencies of oscillating outputs 1222 are compared by N/P frequency comparator 1230. The frequency comparison is used by N/P ratio determiner 1240 to determine the relative N/P strengths.

Process 1200B begins with block 1201, wherein a frequency generated with an oscillator having both N-based and P-based components is sampled, e.g., at an output thereof (e.g., outputs 1215). In block 1202, N-based and P-based frequency determination is performed. In block 1203, N/P frequency comparator 1230 compares the frequencies of oscillating outputs 1215. Based on its comparison, N/P frequency comparator 1230 generates a corresponding N/P frequency comparison signal 1233.

In block 1204, the results of the N/P frequency comparison are used to determine the relative NFET/PFET strengths. N/P frequency comparison signal 1233 is input to N/P ratio determination module 1240. N/P ratio determination module 1240 determines (e.g., calculates, applies a process, an algorithm, etc., decides, ascertains, etc.) the relative NFET/PFET strengths of the sources (e.g., N-domino oscillator 1211 and P-domino oscillator 1212) of oscillating output 1215. The relative frequency content of oscillating output 1215 is examined and the relative strength of their dynamic sources, either N-type or P-type is deduced or induced therefrom.

Upon determining the relative NFET/PFET strengths, N/P ratio determination module 1240 outputs a corresponding N/P relative strength output signal 1250. In block 1205, the relative NFET/PFET strengths are output, completing process 1200B. Process 1200B can be performed with fewer steps. For instance, where the process comprises a function, e.g., inherent, in the operation of a system in which the oscillator is disposed, embedded, etc., in one embodiment, sampling of the frequency is obviated. Similarly, where the process is performed with a system functional to determine its own inherent relative N-based/P-based strength, in one embodiment outputting is obviated.

System 1200A and process 1200B function with both DC/low frequency circuits and low voltage circuits, e.g., latched and unlatched circuits, as described above. Conventionally, analog circuits are typically used for determining relative N/P strength. However, typical analog circuits may not operate efficiently in at very low voltage applications, although determining the relative N/P strength therein is desirable. Advantageously, the circuits described herein, operate efficiently at voltages low enough to be useful in applications where conventional analog and digital N/P strength determination techniques may be inefficient. The circuits described above that function without latching (e.g., N-domino based circuits 500, 600, 700; FIGS. 5A-5B, 6A-6B, and 7, respectively and their unlatched P-based compliments), operate at very low voltages (e.g., ultra-low Vmin operation). Thus, they provide the benefit of allowing determination of their relative N/P strengths without resort to conventional analog circuits.

In summary, the exemplary embodiments described above include circuits, systems and methods relating to a dynamic ring oscillator. A dynamic oscillating ring circuit has multiple domino circuits, each having a signal input, a trigger input, inputs for charge state and cutoff clocks and an output inverter. A number of the domino circuits are coupled in series, the output of one feeding the input of the next, to form a chain, which form stages of the ring. A number of the stages are coupled in series, the output of one feeding the input of the next, to form the ring. The first domino circuit of said chain receives a logic signal input and a single trigger input for the chain. Within the ring, the output of each stage feeds the input signal to the next stage and is fed back to clock an earlier stage to allow the ring to oscillate.

Embodiments of the present invention, circuits, systems and methods relating to a dynamic ring oscillator, are thus described. While the present invention has been described in particular embodiments, it should be appreciated that the present invention should not be construed as limited by such embodiments, but rather construed according to the following claims.

What is claimed is:

1. A circuit comprising:
    a plurality of domino circuit chains coupled in series, wherein an output of each domino circuit chain is coupled to an input of another domino circuit chain and the output of each domino circuit chain clocks an earlier domino circuit chain, and wherein a trigger input of a first one of the plurality of domino circuit chains receives a trigger signal.

2. The circuit of claim 1, wherein each domino circuit chain comprises:
    an even number of domino circuits coupled in series, wherein the domino circuits of a given domino circuit chain are clocked substantially simultaneously.

3. The circuit of claim 2, wherein the domino circuits comprise non-inverting domino circuits.

4. The circuit of claim 2, wherein the domino circuits comprise N-footed domino circuits.

5. The circuit of claim 2, wherein the domino circuits comprise P-footed domino circuits.

6. The circuit of claim 2, wherein each domino circuit comprises:
    a logic tree circuit including a first input coupled to a trigger input of the domino circuit and a second input coupled to a ring input of a given domino circuit;
    a clocked pre-charge device coupled to the logic tree circuit and including an input coupled to a clock input of the given domino circuit;
    a clocked cutoff device coupled to the logic tree circuit and including an input coupled to the clock input of the given domino circuit; and
    an inverter including an input coupled to an output of the logic tree circuit and an output coupled to the ring output of the given domino circuit.

7. The circuit of claim 6, wherein each domino circuit further comprises a latch circuit coupled between the output and the input of the inverter.

8. The circuit of claim 1, further comprising a ring out inverter having an input coupled to the ring output of a second one of the plurality of domino circuit chains.

9. The circuit of claim 1, further comprising a pulse generator coupled to the ring input of the first one of the plurality of domino circuit chains.

10. The circuit of claim 9, wherein the pulse generator comprises:
    an inhibit-to-evaluate margin delay circuit having an input coupled to an enable signal; and
    a trigger-on-enable pulse generator circuit having an input coupled to the inhibit-to-evaluate margin delay circuit and an output coupled to the trigger input of the first one of the plurality of domino circuit chains.

11. The circuit of claim 9, wherein the pulse generator is external to the plurality of domino circuit chains and does not arise from a component of the plurality of domino circuit chains.

12. The circuit of claim 1, further comprising:
    a plurality of clock buffer circuits, wherein an output of each clock buffer circuit is coupled to a given domino circuit chain; and
    a plurality of inhibit and initialize gating circuits, wherein each inhibit and initialized gating circuit includes an output coupled to a given block buffer circuit, a first input coupled to an enable signal and a second input coupled the ring output of another domino circuit chain.

13. The circuit of claim 1, wherein the trigger input of each of the domino circuit chains is disabled except for the first one of the plurality of domino circuit chains.

14. A circuit comprising:
    a plurality of N-Footed domino circuit chains coupled in series, wherein a ring output of each N-Footed domino circuit chain is coupled to a ring input of another N-Footed domino circuit chain and the ring output of each N-Footed domino circuit chain clocks an earlier N-Footed domino circuit chain, and wherein a trigger input of a first one of the plurality of N-Footed domino circuit chains receives a trigger input;
    a plurality of P-Footed domino circuit chains coupled in series, wherein a ring output of each P-Footed domino circuit chain is coupled to a ring input of another P-Footed domino circuit chain and the ring output of each P-Footed domino circuit chain clocks an earlier P-Footed domino circuit chain, and wherein a trigger input of a first one of the plurality of P-Footed domino circuit chains receives a trigger input;
    a first frequency detector coupled to a ring output of a second one of the plurality of the plurality of N-footed domino circuit chains;
    a second frequency detector coupled to a ring output of a second one of the plurality of the plurality of P-footed domino circuit chains; and
    a frequency comparator circuit having a first input coupled to an output of the first frequency detector, a second input coupled to an output of the second frequency detector and outputting a frequency comparison signal.

15. The circuit of claim 14, wherein:
    the plurality of N-Footed domino circuit chains are self-untriggered; and
    the plurality of P-Footed domino circuit chains are self-untriggered.

16. The circuit of claim 14, wherein:
    each N-Footed domino circuit chain comprises an even number of N-Footed non-inverting domino circuits coupled in series; and
    each P-Footed domino circuit chain comprises the even number of P-Footed non-inverting domino circuits coupled in series.

* * * * *